United States Patent
Yamashita et al.

(10) Patent No.: US 6,762,129 B2
(45) Date of Patent: Jul. 13, 2004

(54) DRY ETCHING METHOD, FABRICATION METHOD FOR SEMICONDUCTOR DEVICE, AND DRY ETCHING APPARATUS

(75) Inventors: Takeshi Yamashita, Takatsuki (JP); Takao Yamaguchi, Kyoto (JP); Hideo Niko, Otsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 84 days.

(21) Appl. No.: 09/826,098

(22) Filed: Apr. 5, 2001

(65) Prior Publication Data

US 2001/0034138 A1 Oct. 25, 2001

(30) Foreign Application Priority Data

Apr. 19, 2000 (JP) .................................... 2000-117502

(51) Int. Cl.[7] ............................................. H01L 21/302
(52) U.S. Cl. ..................................... 438/706; 438/716
(58) Field of Search ................................. 438/706, 710, 438/712, 714, 719; 216/63, 67, 79

(56) References Cited

U.S. PATENT DOCUMENTS

| | | | | |
|---|---|---|---|---|
| 5,872,063 A | * | 2/1999 | Chao et al. | 438/762 |
| 6,060,371 A | * | 5/2000 | Shinmura | 438/424 |
| 6,124,212 A | * | 9/2000 | Fan et al. | 438/709 |
| 6,180,533 B1 | * | 1/2001 | Jain et al. | 438/714 |
| 6,261,921 B1 | * | 7/2001 | Yen et al. | 438/424 |
| 6,402,974 B1 | * | 6/2002 | Trevor et al. | 216/67 |
| 6,426,477 B1 | * | 7/2002 | Koshimizu et al. | 219/121.41 |

FOREIGN PATENT DOCUMENTS

| | | |
|---|---|---|
| JP | 01-106432 | 4/1989 |
| JP | 03-280536 | 12/1991 |
| JP | 08-288256 | 11/1996 |
| JP | 09-082495 | 3/1997 |
| JP | 11-145111 | 5/1999 |
| JP | 11-238722 | 8/1999 |
| JP | 11-251292 | 9/1999 |

* cited by examiner

*Primary Examiner*—Kin-Chan Chen
(74) *Attorney, Agent, or Firm*—Nixon Peabody LLP; Donald R. Studebaker

(57) ABSTRACT

When etching is performed with respect to a silicon-containing material by using a dry etching apparatus having a dual power source, the application of bias power is initiated before oxidization proceeds at a surface of the silicon-containing material. Specifically, the application of the bias power is initiated before the application of source power is initiated. Alternatively, the source power and the bias power are applied such that the effective value of the source power reaches a second predetermined value after the effective value of the bias power reaches a first predetermined value.

6 Claims, 16 Drawing Sheets

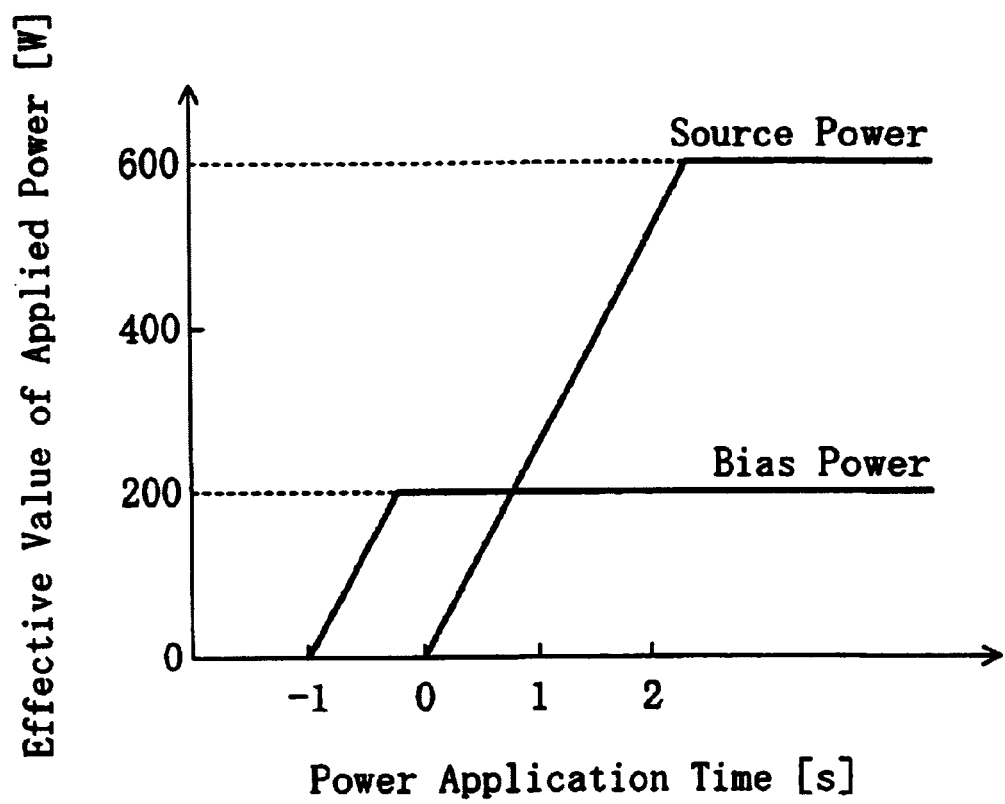

US 6,762,129 B2

DRY ETCHING METHOD, FABRICATION METHOD FOR SEMICONDUCTOR DEVICE, AND DRY ETCHING APPARATUS

BACKGROUND OF THE INVENTION

The present invention relates to a dry etching method for a material containing silicon, a method for fabricating a semiconductor device using the dry etching method, and a dry etching apparatus for implementing the dry etching method.

When dry etching is performed with respect to a material containing silicon (hereinafter referred to as the silicon-containing material) in the fabrication of a semiconductor device, a dry etching apparatus having a dual power source such as an inductively coupled plasma etching apparatus (ICP) has been used to miniaturize a semiconductor element and increase the precision thereof. The dry etching apparatus having the dual power source features separate and controlled application of first electric power (hereinafter referred to as source power) for generating a plasma of a process gas introduced into a chamber and adjusting the density of the plasma and second electric power (hereinafter referred to as bias power) for drawing ions (etching species) from the plasma into an object to be etched. The use of the dry etching apparatus having the dual power source provides high-accuracy processing properties. In a typical dry etching apparatus having a dual power source, the source power is applied to a coil or the like provided on an outer wall of the chamber and the bias power is applied to a sample stage provided in the chamber to carry the object to be etched.

The step of forming an isolation in a silicon substrate has conventionally used LOCOS (Local Oxidization of Silicon) for forming the isolation by locally oxidizing the silicon substrate masked with a nitride film. As feature sizes have been reduced increasingly, however, the problem has arisen that the isolation is larger than a desired size, which makes it difficult to provide an active region having a sufficient size. To solve the problem, STI (Shallow Trench Isolation) has been used as a replacement in which an isolation is formed by forming a trench in a silicon substrate, filling an oxide film in the trench, and then planarizing a surface of the silicon substrate including a surface of the oxide film by CMP (Chemical Mechanical Polishing). The foregoing dry etching apparatus having the dual power source is used to form the trench for isolation.

Herein below, a conventional method for fabricating a semiconductor device, specifically a method for forming a trench for isolation by etching a silicon substrate by using the dry etching apparatus having the dual power source will be described with reference to the drawings.

FIGS. 11A to 11D are cross-sectional views illustrating the individual process steps of the conventional method for fabricating a semiconductor device.

First, as shown in FIG. 11A, a first silicon oxide film 81 is formed on a silicon substrate 80 by thermal oxidation, followed by a silicon nitride film 82 formed on the first silicon oxide film 81 by using a film forming method such as CVD (chemical vapor deposition). Then, a resist pattern 83 having openings each corresponding to a region to be formed with an isolation is formed on the silicon nitride film 82 by photolithography.

Next, as shown in FIG. 11B, dry etching is performed with respect to the silicon nitride film 82 and to the first silicon oxide film 81 by using the resist pattern 83 as a mask, thereby patterning each of the silicon nitride film 82 and the first silicon oxide film 81. Thereafter, the resist pattern 83 is removed by ashing and the silicon substrate 80 is cleaned.

Next, as shown in FIG. 11C, dry etching is performed with respect to the silicon substrate 80 by using the patterned silicon nitride film 82 as a mask, thereby forming trenches 84 for isolation in the silicon substrate 80. A detailed description will be given to the dry etching step shown in FIG. 11C. First, the silicon substrate 80 as an object to be etched is placed in the chamber (not shown) of the dry etching apparatus. Then, the chamber is evacuated till a specified degree of vacuum is reached and a gas required to etch the silicon substrate 80 (hereinafter referred to as a process gas), specifically a mixture of a halogen-containing gas such as $Cl_2$ or HBr and an oxygen gas is introduced into the chamber. Subsequently, a plasma of the process gas is generated by initiating the application of source gas and then ions in the plasma are drawn into the silicon substrate 80 by initiating the application of bias power. As a result, the ions in the plasma and an exposed portion of the silicon substrate 80 react with each other to form a volatile reaction product (such as a compound of silicon and chlorine). At this stage, dry etching is performed with respect to the silicon substrate 80 by evacuating the chamber and thereby exhausting the foregoing volatile reaction product from the chamber. Thereafter, the silicon substrate 80 is cleaned such that a deposit (such as a compound of the foregoing volatile reaction product and oxygen) formed on the silicon substrate 80 during dry etching is removed therefrom, whereby the trenches 84 are formed in the silicon substrate 80.

Since the dry etching step shown in FIG. 11C requires processing accuracy as high as required by the processing of a gate electrode due to a reduced size of the isolation, a dry etching apparatus having a dual power source such as an inductively coupled plasma etching apparatus is used in the dry etching step.

Next, the portions of the silicon substrate 80 located adjacent the wall and bottom surfaces of the trench 84 are thermally oxidized by using an oxidation furnace in order to lower a surface state in the portions of the silicon substrate 80. Then, a second silicon oxide film 85 is deposited on the silicon nitride film 82 by CVD to completely fill the trench 84. Subsequently, a surface of the silicon nitride film 82 including a surface of the second silicon oxide film 85 is planarized by CMP such that the portions of the second silicon oxide film 85 located externally of the trenches 84 are removed. Thereafter, the silicon nitride film 82 is removed by wet etching and the first silicon oxide film 81 remaining on the surface of the silicon substrate 80 is removed by cleaning the silicon substrate 80 as shown in FIG. 11D, whereby isolations composed of the second silicon oxide film 85 filled in the trenches 84 are formed.

A description will be given herein below to a conventional method of applying the source power and the bias power in the dry etching step using the dry etching apparatus having the dual power source and shown in FIG. 11C (hereinafter referred to as the conventional dry etching method) and to the effect of the conventional dry etching method.

FIG. 12 shows an example of the respective time-varying effective values of the source power and the bias power in the conventional dry etching method. In FIG. 12, the time at which the application of the source power is initiated is used as the reference for power application time (0 second). In the present specification, the effective value of the bias power is the effective value of the bias power actually applied to the sample stage and the effective value of the source power is the effective value of the source power actually applied to the coil or the like. The effective value is defined herein as the value of an alternating power equal to the square root of the arithmetic mean of the squares of the instantaneous values taken throughout one complete cycle.

As shown in FIG. 12, the application of the bias power is initiated one second after the application of the source power is initiated. On the other hand, the effective value of the source power is set to 600 W, while the effective value of the bias power is set to 200 W.

FIGS. 13A to 13C are views showing the effect of the conventional dry etching method, specifically showing changes in the internal state of the chamber of the dry etching apparatus in the dry etching step shown in FIG. 1C, of which FIG. 11A shows the state immediately after the introduction of the process gas into the chamber, FIG. 11B shows the state immediately after the application of the source power is initiated, and FIG. 11C shows the state immediately after the application of the bias power is initiated. It is to be noted that the silicon nitride film and the like on the silicon substrate as well as the sample stage and the like in the chamber are not depicted in FIGS. 13A to 13C.

First, as shown in FIG. 13A, the silicon substrate 80 as an object to be etched is placed in a chamber 86 of the dry etching apparatus. Then, the chamber 86 is evacuated till a specified degree of vacuum is reached and a process gas 87 required to etch the silicon substrate 80 is introduced into the chamber 86. Then, as shown in FIG. 13B, a plasma 87A of the process gas 87 is generated with application of the source gas. Thereafter, ions 88 in the plasma 87A are drawn into the silicon substrate 80 with application of the bias power, as shown in FIG. 13C.

Thus, the dry etching apparatus having the dual power source is capable of controlling the generation of the plasma of the process gas and the adjustment of the plasma density independently of the drawing of the ions from the plasma into the object to be etched. In accordance with the conventional dry etching method using the dry etching apparatus having the dual power source, therefore, etching is performed with respect to the object to be etched by generating the plasma of the process gas with application of the source power and then drawing the ions from the plasma into the object to be etched with application of the bias power.

If a trench for isolation is formed in a silicon substrate by using the conventional dry etching method, e.g., however, etching is halted halfway, as shown in FIG. 14, which leads to the problem that the trench for isolation having a desired isolation depth cannot be formed. FIG. 14 shows the state in which etching has been halted halfway in the dry etching step shown in FIG. 11C. In FIG. 14, the same reference numerals as used in FIG. 11C are retained for the same members.

If the conventional dry etching method is used for a silicon substrate or the like as an object to be etched, an etching-induced damaged layer is formed in the silicon substrate or the like, which causes the problem that the electric characteristics of the semiconductor device are degraded.

If a trench for isolation is formed in a silicon substrate by using the conventional dry etching method, e.g., it is necessary to thermally oxide the portions of the silicon substrate located adjacent the wall and bottom surfaces of the trench for isolation in order to lower a surface state in the portions of the silicon substrate, while cost for fabricating the semiconductor device is increased disadvantageously by using an oxidation furnace.

SUMMARY OF THE INVENTION

In view of the foregoing, it is therefore a first object of the present invention to prevent a halfway halt in etching performed with respect to a silicon-containing material by using an etching apparatus having a dual power source. A second object of the present invention is to prevent the degradation of the electric characteristics of a semiconductor device induced by a damaged layer formed in the silicon-containing material during dry etching. A third object of the present invention is to lower a surface state in the portions of the silicon substrate located adjacent the wall and bottom surfaces of a trench for isolation at low cost.

To attain the first object, the present inventors have examined the cause of an etching halt in the conventional dry etching method (see FIG. 14) and found the following fact.

FIGS. 15A to 15C are views illustrating the mechanism of the etching halt occurring in the conventional dry etching method, specifically showing the internal states of the chamber of a dry etching apparatus at different times in the dry etching step shown in FIG. 11C, of which FIG. 15A shows the state immediately after the application of the source power is initiated in the chamber in which a process gas has been introduced, FIG. 15B shows the state in which the application of the source power is continued before the application of the bias power is initiated, and FIG. 15C shows the state immediately after the application of the bias power is initiated. It is to be noted that a silicon nitride film and the like on a silicon substrate as well as a sample stage and the like in the chamber are not depicted in FIGS. 15A to 15C.

First, as shown in FIG. 15A, the silicon substrate 80 as an object to be etched is placed in the chamber 86 of the dry etching apparatus. Then, the chamber 86 is evacuated till a specified degree of vacuum is reached. Subsequently, the process gas 87 (such as a mixture of a halogen-containing gas and an oxygen gas) required to etch the silicon substrate 80 is introduced into the chamber 86 and the source power is applied, whereby the plasma 87A of the process gas 87 is generated.

Next, if the application of the source power is continued before the application of the bias power is initiated, active oxygen (hereinafter referred to as oxygen radicals) 89 is generated in conjunction with the ions 88 as an etching species in the plasma 87A, as shown in FIG. 15B. At this time, the oxygen radicals 89 and an exposed portion of the silicon substrate 80 react with each other to form a thin silicon oxide film 90 on the silicon substrate 80.

Next, as shown in FIG. 15C, the ions 88 in the plasma 87 are drawn into the silicon substrate 80 with application of the bias power. However, since the silicon oxide film 90 has been formed on the silicon substrate 80 as an object to be etched and an etching speed for the silicon oxide film is about one hundredth of an etching speed for silicon, etching performed with respect to the silicon substrate 80 hardly proceeds.

To verify the mechanism of the etching halt in the conventional dry etching method (FIGS. 15A to 15C), the present inventors conducted the following two experiments.

First, to verify oxidization at a surface of the silicon substrate when the application of the source power is continued before the application of the bias power is initiated in the first experiment, the thickness of the silicon oxide film formed on the surface of the silicon substrate was measured by exposing the silicon substrate to the plasma generated only with application of the source power for a specified period. At this time, an inductively coupled plasma etching apparatus was used as a dry etching apparatus having a dual power source and the respective effective values of the source power and the bias power were set to 600 W and 0 W. As a process gas, a mixture of $Cl_2$ and $O_2$ gases (Pressure: 7 Pa, $Cl_2$ Gas Flow Rate: 150 ml/min, $O_2$ Gas Flow Rate: 6 ml/min) was used.

FIG. 16 shows the result of the first experiment, specifically the dependence of the thickness of the oxide film (the vertical axis) at the surface of the silicon substrate on the source power application period (the horizontal axis).

As shown in FIG. 16, it was found that, if the application of the source power was initiated before the application of the bias power was initiated, oxidization at the surface of the silicon substrate proceeds with a lapse of the source power application period to form a thick oxide.

Next, to verify the relationship between each of the timing of applying the source power and the timing of applying the bias power and a halt in etching performed with respect to the silicon substrate in the second experiment, the etching depth (hereinafter referred to as an amount of shaved silicon) was measured when dry etching was performed with respect to the silicon substrate, while varying the timing of initiating the application of the source power and the timing of initiating the application of the bias power. As a sample used in the second embodiment, a silicon substrate formed by the conventional method for fabricating a semiconductor device shown in FIGS. 11A and 11B (the silicon substrate 80 formed with the silicon nitride film 82 as a mask pattern for forming isolation) was selected.

An objective value of the amount of shaved silicon was set to 300 nm in the second experiment. As a dry etching apparatus having a dual power source, an inductively coupled plasma etching apparatus was used and the respective effective values of the source power and the bias power were set to 600 W and 200 W. As a process gas, a mixture of $Cl_2$ and $O_2$ gases (Pressure: 7 Pa, $Cl_2$ Gas Flow Rate: 150 ml/min, $O_2$ Gas Flow Rate: 6 ml/min) was used.

In the second embodiment, the time at which the application of the source power was initiated was used as the reference time and the time at which the application of the bias power was initiated was expressed as a delay time from the reference time (which assumes a negative value if the time at which the application of the bias power was initiated precedes the time at which the application of the source power was initiated).

FIG. 17 shows the result of the second experiment, specifically shows the dependence of the amount of shaved silicon (the vertical axis) on the delay time (the horizontal axis).

As shown in FIG. 17, it was found that a halt in etching performed with respect to the silicon substrate occurred if the application of the source power was initiated before the application of the bias power was initiated. Specifically, even if an interval between the time at which the plasma is generated with application of the source power and the time at which the application of the bias power is initiated, i.e., an interval between the time at which the application of the source power is initiated and the time at which etching of the silicon substrate is initiated is short, oxidization proceeds at the surface of the silicon substrate and etching performed with respect to the silicon substrate is halted consequently.

From the results shown in FIGS. 16 and 17, the present inventors have concluded that, to attain the first object, i.e., to prevent a halfway halt in dry etching performed with respect to the silicon-containing material, it is important to prevent oxidization at a surface of the silicon-containing material during dry etching. As a specific method for preventing oxidization at the surface of the silicon-containing material, the present inventors have developed a method of initiating the application of the bias power before initiating the application of the source power in the dry etching apparatus having the dual power source. As a value predetermined for an effective value of applied power is larger, the time required by the effective value to reach the predetermined value from the initiation of the application thereof becomes longer. Even in the case where a value predetermined for the effective value of the source power (second predetermined value) is higher than a value predetermined for the effective value of the bias power (first predetermined value) and where the application of the source power is initiated at the same time as or before the application of the bias power is initiated, if the effective value of the source power reaches the second predetermined value after the effective value of the bias power reaches the first predetermined value, effects equal to those achieved by the foregoing "method of initiating the application of the bias power before initiating the application of the source power" are achievable.

The present inventors have also found that, if etching is performed with respect to the silicon-containing material by using the dry etching apparatus having the dual power source, the second object can be attained, i.e., the degradation of the electric characteristics of the semiconductor device can be prevented by applying the source power by continuously using the same dry etching apparatus having the dual power source as used for etching without applying the bias power, thereby oxidizing the damaged layer formed in the silicon-containing material during etching and then removing the oxidized damaged layer by cleaning the substrate.

Further, the present inventors have found that the third object can be attained, i.e., a surface state in the portions of the silicon substrate located adjacent the wall and bottom surfaces of the trench for isolation can be lowered at low cost without using an oxidation furnace by applying the source power in the dry etching apparatus having the dual power source without applying the bias power and thereby oxidizing the portions of the silicon substrate located adjacent the wall and bottom surfaces of the trench for isolation.

The present invention has been achieved based on the foregoing findings. Specifically, to attain the first object, a dry etching method according to the present invention assumes a dry etching method using a dry etching apparatus having a dual power source capable of independently controlling source power for generating a plasma in a chamber and bias power for drawing ions from the plasma into an object to be etched in the chamber, the method comprising the steps of: placing a substrate having a member containing at least silicon exposed thereat in the chamber; introducing a process gas containing at least oxygen into the chamber in which the substrate has been placed; and performing etching with respect to the member by generating a plasma of the process gas with application of the source power and drawing the ions from the plasma into the member with application of the bias power, the step of performing etching with respect to the member including the step of initiating the application of the bias power before oxidization proceeds at a surface of the member.

If etching is performed with respect to the silicon-containing material as the object to be etched by using the dry etching apparatus having the dual power source, the dry etching method of the present invention initiates the application of the bias power before the oxidization at the surface of the silicon-containing material proceeds. This prevents the situation in which the drawing of the ions from the plasma into the silicon-containing material is inhibited by an oxide film formed on the surface of the silicon-containing material and surely prevents a halfway halt in dry etching performed with respect to the silicon-containing material.

In the dry etching method of the present invention, the step of performing etching with respect to the member preferably includes the step of initiating the application of the bias power before initiating the application of the source power.

The arrangement ensures the drawing of the ions from the plasma into the silicon-containing material before the surface of the silicon-containing material is oxidized by oxygen radicals generated in the plasma with application of the source power and thereby ensures etching performed with respect to the silicon-containing material.

In the dry etching method of the present invention, the step of performing etching with respect to the member preferably includes the step of applying the source power and the bias power such that an effective value of the source power reaches a second predetermined value after an effective value of the bias power reaches a first predetermined value.

The arrangement ensures the drawing of the ions from the plasma into the silicon-containing material before the surface of the silicon-containing material is oxidized by oxygen radicals generated in the plasma with application of the source power and thereby ensures etching performed with respect to the silicon-containing material. Specifically, if the second predetermined value for the source power is higher than the first predetermined value for the bias power, the time at which the effective value of the source power reaches the second predetermined value is posterior to the time at which the effective value of the bias power reaches the first predetermined value even when the application of the source power is initiated at the same time as or before the application of the bias power is initiated. In this case, therefore, the same effect as achieved when the application of the source power is initiated after the application of the bias power is initiated is achievable.

In the dry etching method of the present invention, a silicon substrate, a polysilicon film, an amorphous silicon film, a silicide film, or the like may be used as a silicon-containing material.

To attain the first object, a first method for fabricating a semiconductor device according to the present invention assumes a method for fabricating a semiconductor device using a dry etching apparatus having a dual power source capable of independently controlling source power for generating a plasma in a chamber and bias power for drawing ions from the plasma into an object to be etched in the chamber, the method comprising the steps of: forming a mask pattern having an opening corresponding to a region to be formed with an isolation on a silicon substrate; placing the silicon substrate formed with the mask pattern in the chamber; introducing a process gas containing at least oxygen into the chamber in which the silicon substrate has been placed; and forming a trench for isolation in the silicon substrate by generating a plasma of the process gas with application of the source power, drawing ions from the plasma into the silicon substrate with application of the bias power, and thereby performing etching with respect to the silicon substrate, the step of forming the trench for isolation including the step of initiating the application of the bias power before oxidization proceeds at an exposed portion of the silicon substrate.

If the trench for isolation is formed by performing etching with respect to the silicon substrate by using the dry etching apparatus having the dual power source, the first method for fabricating a semiconductor device initiates the application of the bias power before oxidization proceeds at the exposed portion of the silicon substrate. This prevents the situation in which the drawing of the ions from the plasma into the silicon substrate is inhibited by an oxide film formed on the surface of the silicon substrate and surely prevents a halfway halt in dry etching performed with respect to the silicon substrate. Accordingly, there can be formed the trench for isolation having a desired isolation depth in the silicon substrate.

In the first method for fabricating a semiconductor device, the step of forming the trench for isolation preferably includes the step of initiating the application of the bias power before initiating the application of the source power.

The arrangement ensures the drawing of the ions from the plasma into the silicon substrate before the surface of the silicon substrate is oxidized by oxygen radicals generated in the plasma with the application of the source power and thereby ensures etching performed with respect to the silicon substrate.

In the first method for fabricating a semiconductor device, the step of forming a trench for isolation preferably includes the step of applying the source power and the bias power such that an effective value of the source power reaches a second predetermined value after an effective value of the bias power reaches a first predetermined value.

The arrangement ensures the drawing of the ions from the plasma into the silicon substrate before the surface of the silicon substrate is oxidized by oxygen radicals in the plasma generated with the application of the source power and thereby ensures etching performed with respect to the silicon substrate.

To attain the first object, a second method for fabricating a semiconductor device according to the present invention assumes a method for fabricating a semiconductor device using a dry etching apparatus having a dual power source capable of independently controlling source power for generating a plasma in a chamber and bias power for drawing ions from the plasma into an object to be etched in the chamber, the method comprising the steps of: forming a conductive film containing at least silicon on a substrate; forming a mask pattern covering a region to be formed with a gate electrode on the conductive film; placing the substrate formed with the conductive film and with the mask pattern in the chamber; introducing a process gas containing at least oxygen into the chamber in which the substrate has been placed; and forming a gate electrode composed of the conductive film by generating a plasma of the process gas with application of the source power, drawing ions from the plasma into the conductive film with application of the bias power, and thereby performing etching with respect to the conductive film, the step of forming the gate electrode including the step of initiating the application of the bias power before oxidization proceeds at an exposed portion of the conductive film.

If the gate electrode is formed by performing etching with respect to the silicon-containing conductive film formed on the substrate by using the dry etching apparatus having the dual power source, the second method for fabricating the semiconductor device initiates the application of the bias power before oxidization proceeds at the exposed portion of the silicon-containing conductive film. This prevents the situation in which the drawing of the ions from the plasma into the silicon-containing conductive film is inhibited by the oxide film formed on the surface of the silicon-containing conductive film and surely prevents a halfway halt in dry etching performed with respect to the silicon-containing conductive film. Accordingly, there can be formed the gate electrode having a desired size.

In the second method for fabricating a semiconductor device, the step of forming the gate electrode preferably includes the step of initiating the application of the bias power before initiating the application of the source power.

The arrangement ensures the drawing of the ions from the plasma into the silicon-containing conductive film before a surface of the silicon-containing conductive film is oxidized by oxygen radicals generated in the plasma with the application of the source power and thereby ensures etching performed with respect to the silicon-containing conductive film.

In the second method for fabricating a semiconductor device, the step of forming the gate electrode preferably includes the step of applying the source power and the bias power such that an effective value of the source power reaches a second predetermined value after an effective value of the bias power reaches a first predetermined value.

The arrangement ensures the drawing of the ions from the plasma into the silicon-containing conductive film before a surface of the silicon-containing conductive film is oxidized by oxygen radicals generated in the plasma with the application of the source power and thereby ensures etching performed with respect to the silicon-containing conductive film.

In the second method for fabricating a semiconductor device, a polysilicon film, an amorphous silicon film, a silicide film, or the like may be used as a silicon-containing conductive film.

To attain the second object, a third method for fabricating a semiconductor device assumes a method for fabricating a semiconductor device by using a dry etching apparatus having a dual power source capable of independently controlling source power for generating a plasma in a chamber and bias power for drawing ions from the plasma into an object to be etched in the chamber, the method comprising the steps of: performing etching with respect to the member by placing a substrate having a member containing at least silicon exposed thereat in the chamber, introducing a first process gas into the chamber, generating a first plasma of the first process gas with application of the source power, and drawing ions from the first plasma into the member with application of the bias power; exhausting the first process gas from the chamber after the step of performing etching with respect to the member and then introducing a second process gas containing at least oxygen into the chamber, while leaving the substrate in the chamber; oxidizing a damaged layer formed in the member in the step of performing etching with respect to the member by generating a second plasma of the second process gas by applying the source power without applying the bias power; and removing the oxidized damaged layer by retrieving the substrate from the chamber and cleaning the substrate.

The third method for fabricating a semiconductor device performs etching with respect to the silicon-containing material by using the dry etching apparatus having the dual power source, oxidizes the damaged layer formed in the silicon-containing material during dry etching by applying the source power without applying the bias power by using the same dry etching apparatus having the dual power source, and then removes the oxidized damaged layer by cleaning the substrate. This prevents the degradation of the electric characteristics of the semiconductor device induced by the damaged layer formed in the silicon-containing material during dry etching. Since the damaged layer can be oxidized by using the dry etching apparatus having the dual power source used for dry etching instead of using an oxidation furnace, the fabrication cost for the semiconductor device can be reduced significantly.

In the third method for fabricating a semiconductor device, the member is preferably a silicon substrate, the step of performing etching with respect to the member preferably includes the step of forming a trench for isolation in the silicon substrate, and the step of oxidizing the damaged layer preferably includes the step of oxidizing the damaged layer formed in portions of the silicon substrate located adjacent wall and bottom surfaces of the trench for isolation.

When the trench for isolation is formed by performing dry etching with respect to the silicon substrate, the arrangement allows low-cost removal of the damaged layer formed in the portions of the silicon substrate located adjacent the wall and bottom surfaces of the trench for isolation.

In the third method for fabricating a semiconductor device, the member is preferably a conductive film formed on the substrate and containing at least silicon, the step of performing etching with respect to the member preferably includes the step of forming a gate electrode composed of the conductive film on the substrate, and the step of oxidizing the damaged layer preferably includes the step of oxidizing the damaged layer formed in a side surface of the gate electrode.

When the gate electrode is formed by performing dry etching with respect to the silicon-containing conductive film formed on the substrate, the arrangement allows low-cost removal of the damaged layer formed in the side surface of the gate electrode.

In this case, a polysilicon film, an amorphous silicon film, a silicide film, or the like may be used as a silicon-containing conductive film.

To attain the third object, a fourth method for fabricating a semiconductor device according to the present invention assumes a method for fabricating a semiconductor device by using a dry etching apparatus having a dual power source capable of independently controlling source power for generating a plasma in a chamber and bias power for drawing ions from the plasma into an object to be etched in the chamber, the method comprising the steps of: placing a silicon substrate formed with a trench for isolation in the chamber; introducing a process gas containing at least oxygen into the chamber in which the silicon substrate has been placed; forming a silicon oxide film by generating a plasma of the process gas by applying the source power without applying the bias power and thereby oxidizing portions of the silicon substrate located adjacent wall and bottom surfaces of the trench for isolation; and forming an isolation by retrieving the substrate from the chamber and filling an insulating film in the trench for isolation formed with the silicon oxide film.

The fourth method for fabricating a semiconductor device oxidizes the portions of the silicon substrate located adjacent the wall and bottom surfaces of the trench for isolation by applying the source power without applying the bias power by using the dry etching apparatus having the dual power source and thereby forms the silicon oxide film. As a result, a surface state in the portions of the silicon substrate located adjacent the wall and bottom surfaces of the trench for isolation can be reduced without using an oxidation furnace. In addition, the breakdown voltage of the isolation can be increased by rounding up the corner portions of the trench for isolation. This achieves a significant reduction in the fabrication cost for the semiconductor device. Moreover, the fourth method for fabricating a semiconductor device allows simultaneous oxidization for removing the damaged layer with oxidization for lowering the surface state and increasing the breakdown voltage by more deeply oxidizing the portions of the silicon substrate located adjacent the wall and bottom surfaces of the trench for isolation than the damaged layer formed during dry etching. In this case, the cleaning step for removing the oxidized damaged layer can be omitted.

The step of forming the isolation of the fourth method for fabricating a semiconductor device may include the step of forming the insulating film on the silicon substrate such that the trench for isolation is completely filled with the insulating film, planarizing a surface of the silicon substrate including a surface of the insulating film by CMP, and thereby removing a portion of the insulating film located externally of the trench for isolation.

To attain the first object, a dry etching apparatus according to the present invention assumes a dry etching apparatus having a dual power source capable of independently controlling source power for generating a plasma in a chamber and bias power for drawing ions from the plasma into an object to be etched in the chamber, the apparatus comprising: bias power applying means for initializing and operating a timer at the same time as application of the bias power is initiated; and source power applying means for initiating application of the source power when an elapsed time measured by the timer reaches a specified time.

In the dry etching apparatus of the present invention, the source power applying means initiates the application of the source power when the time elapsed from the time at which the bias power applying means initiates the application of the bias power reaches the specified time. In short, the application of the bias power is inevitably initiated before the application of the source power is initiated. Even if etching is performed with respect to the silicon-containing material as the object to be etched by using a process gas containing oxygen, therefore, the ions in the plasma can surely be drawn into the silicon-containing material by initiating the application of the bias power before the silicon-containing material is oxidized by oxygen radicals generated in the plasma with the application of the source power. This prevents the situation in which the drawing of the ions from the plasma into the silicon-containing material is inhibited by an oxide film formed on a surface of the silicon-containing material and surely prevents a halfway halt in dry etching performed with respect to the silicon-containing material.

BRIEF DESCRIPTION OF THE DRAWINGS

FIG. 2 shows an example of the respective time-varying effective values of source power and bias power in a dry etching step of the method for fabricating a semiconductor device according to the first embodiment;

DETAILED DESCRIPTION OF THE INVENTION

Embodiment 1

Figure 1A:
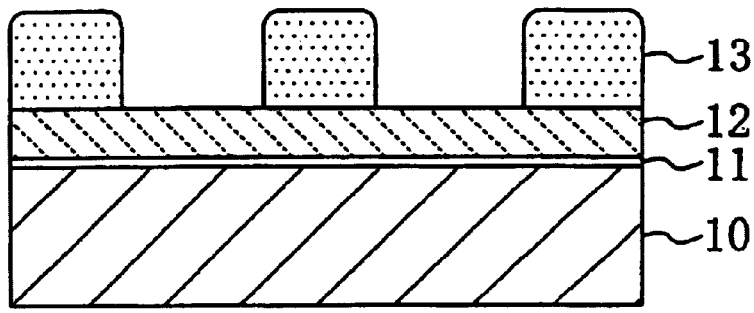
FIGS. 1A to 1D are cross-sectional views illustrating the individual process steps of a method for fabricating a semiconductor device according to a first embodiment of the present invention.

Referring now to the drawings, a method for fabricating a semiconductor device according to a first embodiment of the present invention will be described.

FIGS. 1A to 1D are cross-sectional views illustrating the individual process steps of the method for fabricating a semiconductor device according to the first embodiment.

First, as shown in FIG. 1A, a silicon oxide film 11 is formed on a silicon substrate 10 by, e.g., thermal oxidation, followed by a silicon nitride film 12 formed on the first silicon oxide film 11 by using a film forming method such as CVD. Then, a resist pattern 13 having openings each corresponding to a region to be formed with an isolation is formed on the silicon nitride film 12 by photolithography.

Figure 1B:
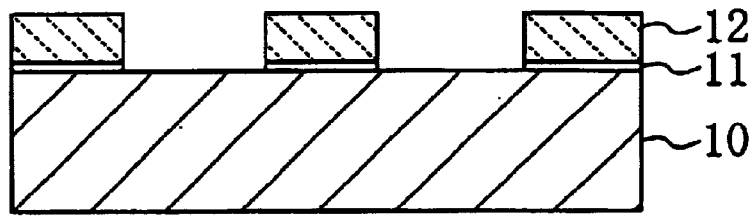

Next, as shown in FIG. 1B, dry etching is performed with respect to the silicon nitride film 12 and to the first silicon oxide film 11 by using the resist pattern 13 as a mask, thereby pattering each of the silicon nitride film 12 and the first silicon oxide film 11. Thereafter, the resist pattern 13 is removed by ashing and the silicon substrate 10 is cleaned.

Figure 1C:
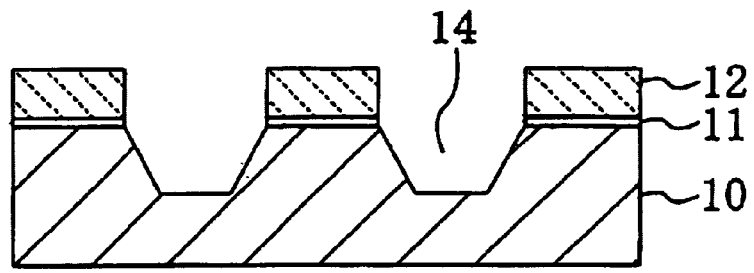

Next, as shown in FIG. 1C, dry etching is performed with respect to the silicon substrate 10 by using the patterned silicon nitride film 12 as a mask, thereby forming trenches 14 for isolation in the silicon substrate 10. A detailed description will be given to the dry etching step shown in FIG. 1C. First, the silicon substrate 10 as an object to be etched is placed in the chamber (not shown) of a dry etching apparatus. Then, the chamber is evacuated till a specified degree of vacuum is reached and a process gas required to etch the silicon substrate 10, e.g., a mixture of a halogen-containing gas and an oxygen gas, is introduced into the chamber. Then, a first plasma of the process gas is generated and ions in the first plasma are drawn into the silicon substrate 10 by initiating the application of the bias power. Subsequently, a second plasma of the process gas is generated and ions in the second plasma are drawn into the silicon substrate 10 by initiating the application of the source power, while continuing the application of the source power. As a result, the ions in the plasma and an exposed portion of the silicon substrate 10 react with each other to form a volatile reaction product. At this time, dry etching is performed with respect to the silicon substrate 10 by evacuating the chamber and thereby exhausting the foregoing volatile reaction product from the chamber. Thereafter, the silicon substrate 10 is retrieved from the chamber and cleaned such that a deposit formed on the silicon substrate 10 during dry etching is removed therefrom, whereby the trenches 14 are formed in the silicon substrate 10.

Since the dry etching step shown in FIG. 1C requires processing accuracy as high as required by the processing of a gate electrode due to a reduced size of the isolation, a dry etching apparatus having a dual power source such as an inductively coupled plasma etching apparatus is used therein and the respective effective values of the source power and the bias power are set to 600 W and 200 W. As a process gas, a mixture of, e.g., $Cl_2$ and $O_2$ gases (Pressure: 7 Pa, $Cl_2$ Gas Flow Rate: 150 ml/min, $O_2$ Gas Flow Rate: 6 ml/min) is used. The application of the bias power is initiated, e.g., one second before the application of the source power is initiated. FIG. 2 shows an example of the respective time-varying effective values of the source power and the bias power in the dry etching step shown in FIG. 1C. In FIG. 2, the time at which the application of the source power is initiated is used as the reference for the power application time (0 second).

Figure 1D:
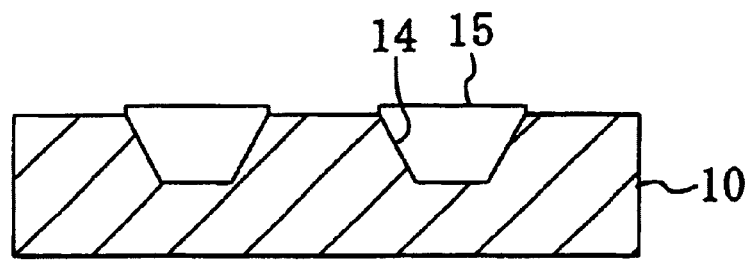

Next, the portions of the silicon substrate 10 located adjacent the wall and bottom surfaces of the trenches 14 are thermally oxidized by using an oxidation furnace such that a surface state in the portions of the silicon substrate 10 is lowered. Then, a second silicon oxide film 15 is deposited on the silicon nitride film 12 by, e.g., CVD to completely fill the trenches 14. Subsequently, a surface of the silicon nitride film 12 including a surface of the second silicon oxide film 15 is planarized by CMP such that the portions of the second silicon oxide film 15 located externally of the trenches 14 are removed. Thereafter, the silicon nitride film 12 is removed by wet etching and the first silicon oxide film 11 remaining on the surface of the silicon substrate 10 is removed by cleaning the silicon substrate 10 as shown in FIG. 1D, whereby isolations composed of the second silicon oxide film 15 filled in the trenches 14 are formed.

A description will be given herein below to a method of applying the source power and the bias power in the dry etching step using the dry etching apparatus having the dual power source and shown in FIG. 1C (hereinafter referred to as the dry etching method of the present invention), which characterizes the method for fabricating a semiconductor device according to the first embodiment, i.e., the method of initiating the application of the bias power before initiating the application of the source power and to the effect of the dry etching method of the present invention.

Figure 3A:
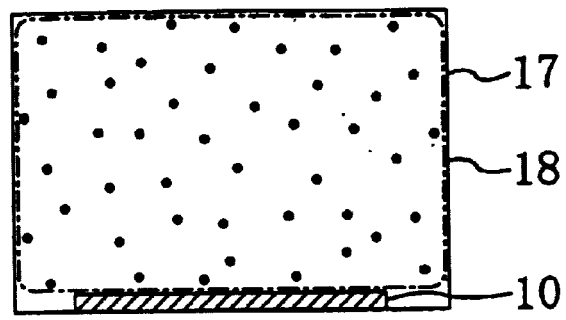
FIGS. 3A to 3C show changes in the internal state of the chamber of a dry etching apparatus in the dry etching step of the method for fabricating a semiconductor device according to the first embodiment.
Figure 3B:
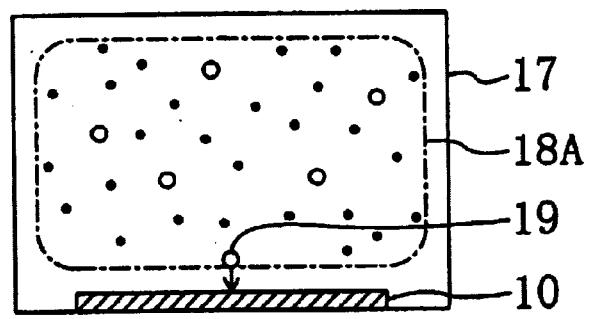
Figure 3C:
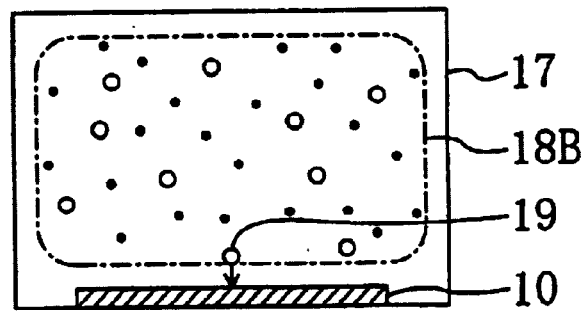

FIGS. 3A to 3C are views illustrating the effect of the dry etching method of the present invention, specifically showing changes in the internal state of the chamber of the dry etching apparatus in the dry etching step shown in FIG. 1C, of which FIG. 3A shows the state immediately after the introduction of the process gas into the chamber, FIG. 3B shows the state immediately after the application of the bias power is initiated, and FIG. 3C shows the state immediately after the application of the source power is initiated. It is to be noted that the silicon nitride film and the like on the silicon substrate as well as the sample stage and the like in the chamber are not depicted in FIGS. 3A to 3C.

First, as shown in FIG. 3A, the silicon substrate 10 as an object to be etched is placed in a chamber 17 of the dry etching apparatus. Then, the chamber 17 is evacuated till a specified degree of vacuum is reached and a process gas 18 required to etch the silicon substrate 10 is introduced into the chamber 17. Then, as shown in FIG. 3B, a first plasma 18A of the process gas 18 is generated and ions 19 in the first plasma 18A are drawn into the silicon substrate 10 with application of the bias power. Thereafter, a second plasma 18B of the process gas 18 is generated and the ions 19 in the second plasma 18B are drawn into the silicon substrate 10 by applying the source power, while continuing the application of the bias power.

Figure 15A:
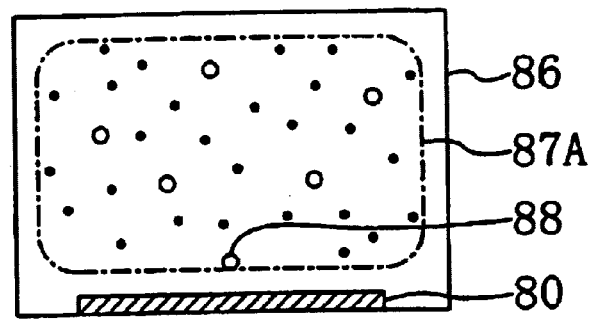
FIGS. 15A to 15C show the mechanism of an etching halt occurring in the dry etching step of the conventional method for fabricating a semiconductor device.
Figure 15B:
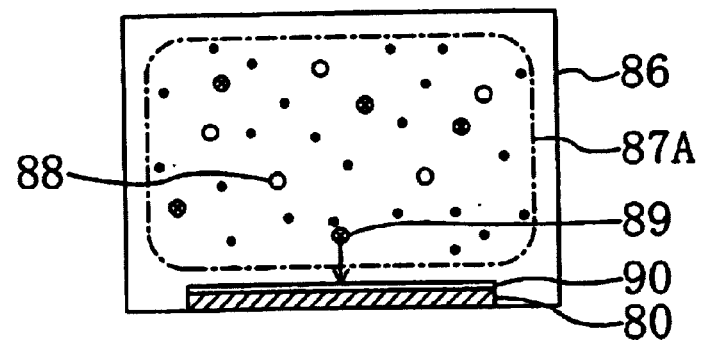
Figure 15C:
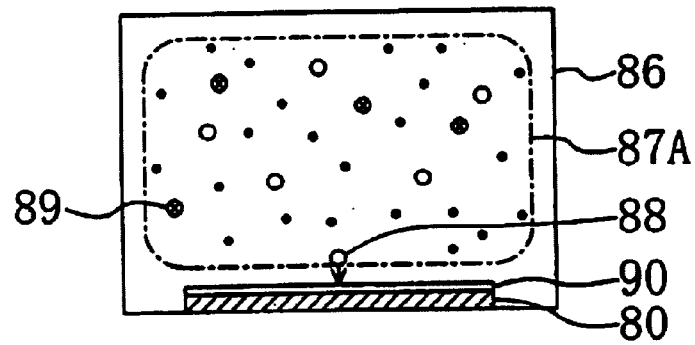
Figure 16:
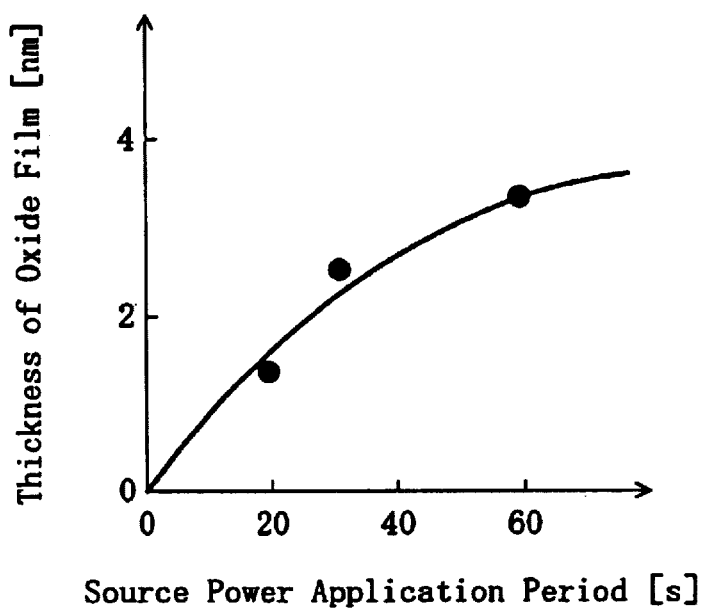
FIG. 16 shows the dependence of the thickness of an oxide film formed on a surface of a silicon substrate on the source power application period when the application of the source power is continued before the application of the bias power is initiated.
Figure 17:
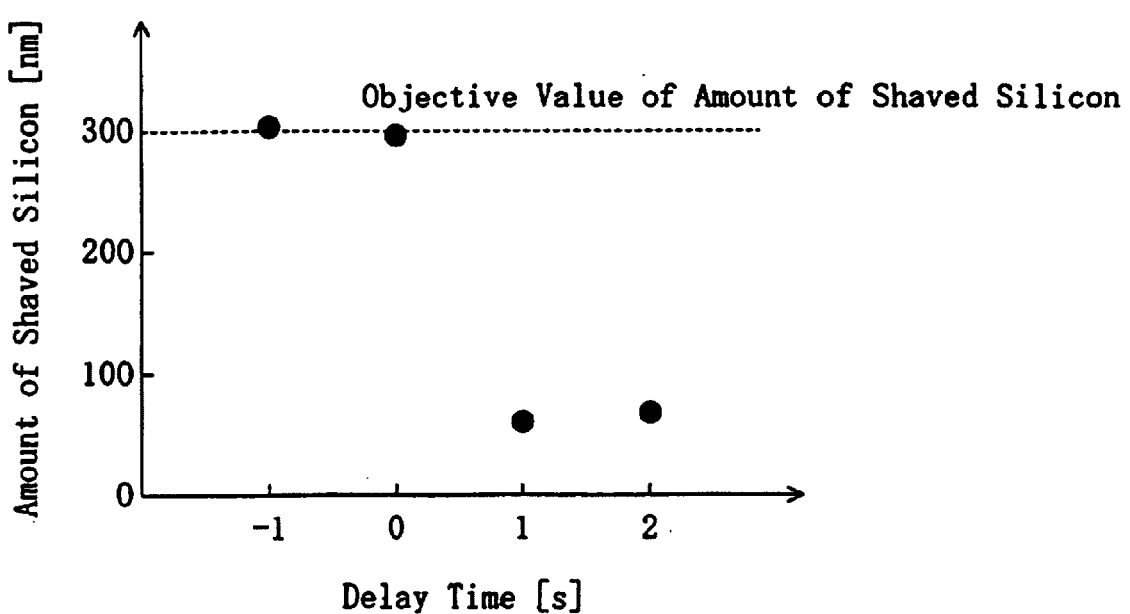
FIG. 17 shows the dependence of the amount of shaved silicon on a delay time in initiating the application of the bias power (the time at which the application of source power is initiated is used as a reference time) when dry etching is performed with respect to a silicon substrate while varying the timing of applying source power and the timing of applying bias power.

In contrast to the conventional dry etching method using the dry etching apparatus having the dual power source in which the application of the bias power is initiated after the application of the source power is initiated, the application of the source power is initiated after the application of the bias power is initiated in the dry etching method of the present invention using the dry etching apparatus having the dual power source. Consequently, the dry etching method of the present invention prevents the situation associated with the conventional dry etching method (see FIGS. 15A to 15C), in which oxygen radicals (active oxygen) in the plasma and an exposed portion of the silicon substrate react with each other to form an oxide film on the silicon substrate before etching is initiated by drawing the ions from the plasma into the silicon substrate. In other words, the dry etching method of the present invention accelerates the ions in the plasma toward the silicon substrate before the oxygen radicals in the plasma and the silicon substrate as the object to be etched react with each other such that etching performed with respect to the silicon substrate is thereby initiated. Specifically, the dry etching method of the present invention initiates the application of the bias power before initiating the application of the source power so that the ions accelerated by the bias power reach the silicon substrate earlier than the oxygen radicals moving randomly. This prevents a halt in etching performed with respect to the silicon substrate resulting from the formation of an oxide film on the silicon substrate.

Thus, when the trenches 14 are formed by performing etching with respect to the silicon substrate 10 by using the dry etching apparatus having the dual power source, the first embodiment initiates the application of the bias power before initiating the application of the source power. This ensures the drawing of the ions from the plasma into the silicon substrate 10 by initiating the application of the bias power before an exposed portion of the silicon substrate 10 is oxidized by oxygen radicals generated in the plasma with application of the source power. Since the drawing of the ions from the plasma into the silicon substrate 10 is no more inhibited by the oxide film formed on the surface of the silicon substrate 10, a halt in dry etching performed with respect to the silicon substrate 10 is surely prevented. This allows the formation of the trenches 14 each having a desired isolation depth in the silicon substrate 10.

Although the first embodiment has used the inductively coupled plasma etching apparatus as the dry etching apparatus having the dual power source, it is also possible to use another dry etching apparatus having a dual power source such as an electron cyclotron resonance (ECR) etcher, a dual-frequency capacitively coupled plasma etcher, or a surface wave plasma (SWP) etcher.

Figure 4:
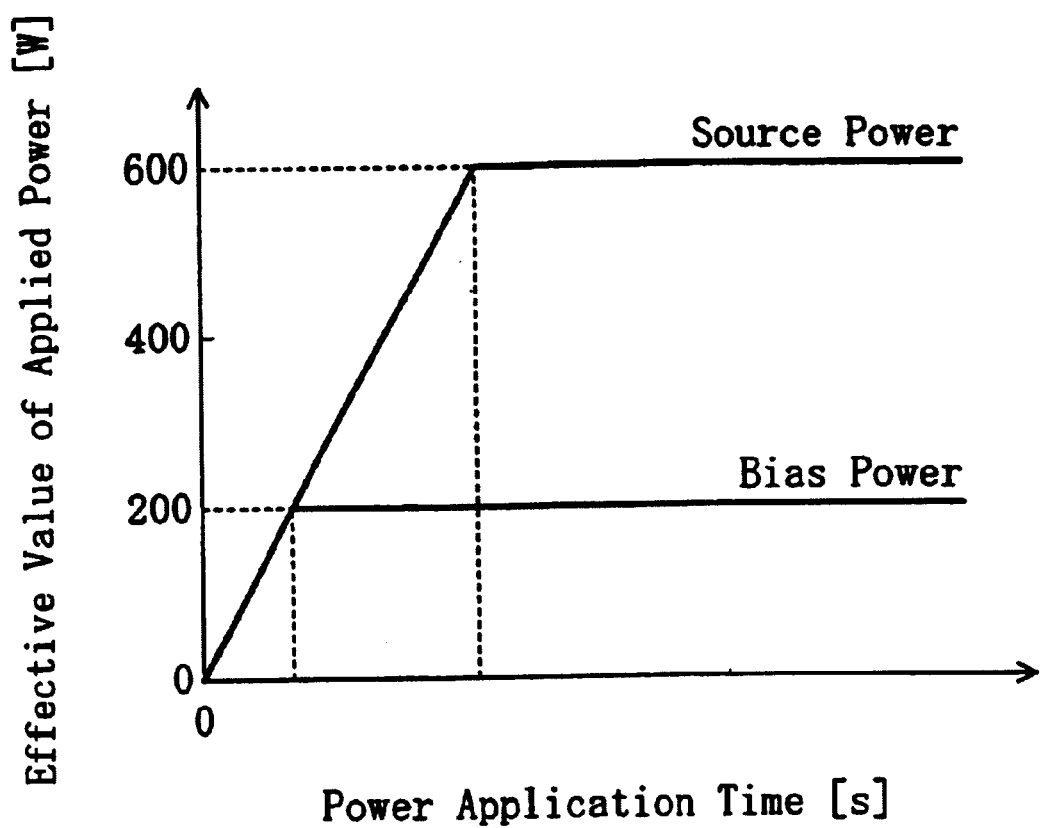
FIG. 4 shows an example of the respective time-varying effective values of the source power and the bias power in the dry etching step of the method for fabricating a semiconductor device according to the first embodiment.

Although the first embodiment has initiated the application of the bias power before initiating the application of the source power, it is also possible to apply, if the application of the source power is initiated at the same time as or before the application of the bias power is initiated when a second value predetermined for the effective value of the source power is higher than a first value predetermined for the effective value of the bias power, the source power and the bias power such that the effective value of the source power reaches the second predetermined value after the effective value of the bias power reaches the first predetermined value. FIG. 4 shows an example of the respective time-varying effective values of the source power and the bias power if the application of the source power is initiated at the same time as the application of the bias power is initiated when the second value predetermined for the effective value of the source power is higher than the first value predetermined for the effective value of the bias power. In FIG. 4, the time at which the application of the source power is initiated is used as the reference for the power application time (0 second) and the respective effective values of the source power and the bias power have been set to 600 W and 200 W.

Although the first embodiment has described the case where dry etching is performed with respect to the silicon substrate to form the trenches for isolation, the first embodiment is not limited thereto. Even if dry etching is performed with respect to a silicon-containing material for another purpose, the effect of preventing a halt in dry etching performed with respect to the silicon-containing material is achievable.

Embodiment 2

A method for fabricating a semiconductor device according to a second embodiment of the present invention will be described with reference to the drawings.

Figure 5A:
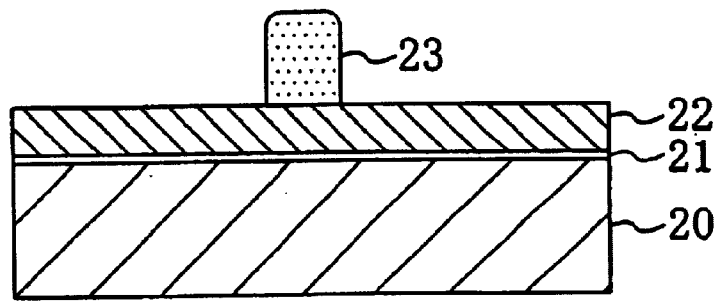
FIGS. 5A to 5C are cross-sectional views illustrating the individual process steps of a method for fabricating a semiconductor device according to a second embodiment of the present invention.
Figure 5B:
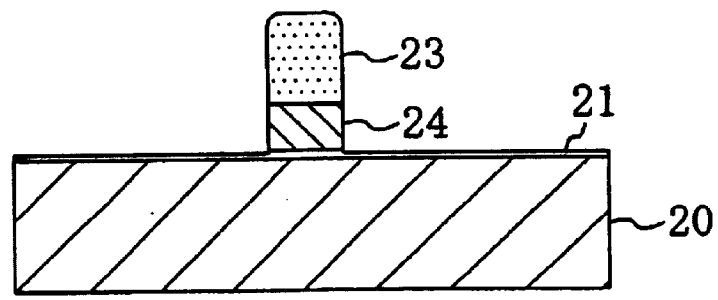
Figure 5C:
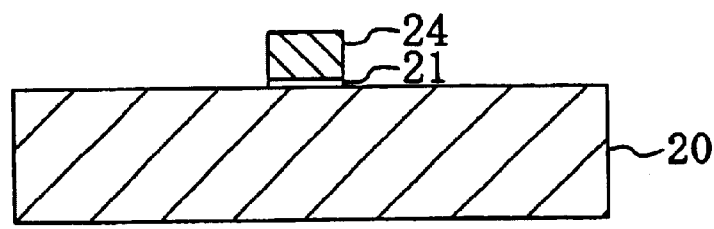

FIGS. 5A to 5C are cross-sectional views illustrating the individual process steps of the method for fabricating a semiconductor device according to the second embodiment.

First, as shown in FIG. 5A, a gate insulating film 21 composed of a silicon oxide film is formed on a silicon substrate 20 by thermal oxidation, followed by a polysilicon film 22 formed on the gate insulating film 21 by using a film forming method such as CVD. Then, a resist pattern 23 covering a region to be formed with a gate electrode is formed on the polysilicon film 22 by photolithography.

Next, as shown in FIG. 5B, dry etching is performed with respect to the polysilicon film 22 masked with the resist pattern 23, thereby forming a gate electrode 24 composed of the polysilicon film 22 on the silicon substrate 20 with the gate insulating film 21 interposed therebetween. A detailed description will be given to the dry etching step shown in FIG. 5B. First, the silicon substrate 20 formed with the polysilicon film 22 as an object to be etched is placed in the chamber (not shown) of a dry etching apparatus. Then, the chamber is evacuated till a specified degree of vacuum is reached and a process gas required to perform etching with respect to the polysilicon film 22, e.g., a mixture of a halogen-containing gas and an oxygen gas, is introduced into the chamber. Thereafter, a first plasma of the process gas is generated and ions in the first plasma are drawn into the polysilicon film 22 by initiating the application of the bias power. Subsequently, a second plasma of the process gas is generated and ions in the second plasma are drawn into the polysilicon film 22 by initiating the application of the source power, while continuing the application of the bias power. As a result, the ions in the plasma and an exposed portion of the polysilicon film 22 react with each other to form a volatile reaction product. At this time, dry etching is performed with respect to the polysilicon film 22 by evacuating the chamber and thereby exhausting the volatile reaction product therefrom, so that a gate electrode 24 composed of the polysilicon film 22 is formed.

Since the dry etching step shown in FIG. 5B requires high processing accuracy due to a reduced gate size of the gate electrode, a dry etching apparatus using a dual power source such as an inductively coupled plasma etching aapparatus is used therein, while the respective effective values of the source power and the bias power have been set to, e.g., 200 W and 50 W. As a process gas, a mixture of, e.g., $Cl_2$, HBr, and $O_2$ gases (Pressure: 4 Pa, $Cl_2$ Gas Flow Rate: 25 ml/min, HBr Gas Flow Rate: 125 ml/min, $O_2$ Gas Flow Rate: 1 ml/min) has been used. In addition, the application of the bias power is performed, e.g., one second before the application of the source power is initiated.

Next, the silicon substrate 20 is retrieved from the chamber and then the resist pattern 23 is removed by ashing, as shown in FIG. 5C. Thereafter, the silicon substrate 20 is cleaned such that a deposit formed during dry etching performed with respect to the polysilicon film 22 and the portion of the gate insulating film 21 located externally of the gate electrode 24 are removed.

Thus, when the gate electrode 24 is formed by performing etching with respect to the polysilicon film 22 by using the dry etching apparatus having the dual power source, the second embodiment initiates the application of the bias power before initiating the application of the source power. This ensures the drawing of the ions from the plasma into the polysilicon film 22 by initiating the application of the bias power before an exposed portion of the polysilicon film 22 is oxidized by oxygen radicals generated in the plasma with application of the source power. Since the drawing of the ions from the plasma into the polysilicon film 22 is no more inhibited by an oxide film formed on the surface of the polysilicon film 22, a halt in dry etching performed with respect to the polysilicon film 22 is surely prevented. This allows the formation of the gate electrode 24 with a desired size.

Although the second embodiment has used the inductively coupled plasma etching apparatus as the dry etching apparatus having the dual power source, it is also possible to use another dry etching apparatus having a dual power source such as an electron cyclotron resonance etcher, a dual-frequency capacitively coupled plasma etcher, or a surface wave plasma etcher.

Although the second embodiment has initiated the application of the bias power before initiating the application of the source power, it is also possible to apply, if the application of the source power is initiated at the same time as or before the application of the bias power is initiated when a second value predetermined for the effective value of the source power is higher than a first value predetermined for the effective value of the bias power, the source power and the bias power such that the effective value of the source power reaches the second predetermined value after the effective value of the bias power reaches the first predetermined value.

Although the second embodiment has used the polysilicon film as a conductive film composing the gate electrode, it is also possible to use another conductive film containing at least silicon, e.g., an amorphous silicon film or a silicide film such as a WSi (tungsten silicide) film.

Although the second embodiment has described the case where dry etching is performed with respect to the polysilicon film to form the gate electrode, it is not limited thereto. Even if dry etching is performed with respect to a silicon-containing material for another purpose, the effect of preventing a halt in dry etching performed with respect to the silicon-containing material is achievable.

Embodiment 3

A method for fabricating a semiconductor device according to a third embodiment of the present invention will be described with reference to the drawings.

FIGS. 6A to 6E are cross-sectional views illustrating the individual process steps of the method for fabricating a semiconductor device according to the third embodiment.

Figure 6A:
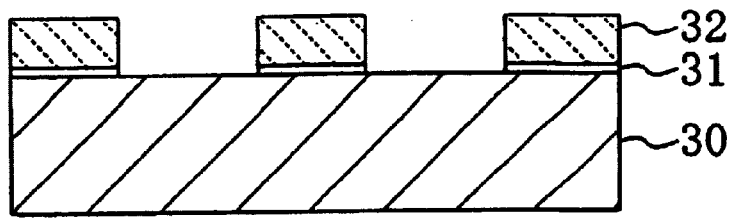
FIGS. 6A to 6E are cross-sectional views illustrating the individual process steps of a method for fabricating a semiconductor device according to a third embodiment of the present invention.

First, as shown in FIG. 6A, a first silicon oxide film 31 is formed on a silicon substrate 30 by, e.g., thermal oxidation, followed by a silicon nitride film 32 formed on the first silicon oxide film 31 by using a film forming method such as CVD. Then, a resist pattern (not shown) having openings each corresponding to a region to be formed with an isolation is formed on the silicon nitride film 32 by photolithography. Thereafter, dry etching is performed with respect to the silicon nitride film 32 and to the first silicon oxide film 31 by using the resist pattern as a mask, thereby patterning each of the silicon nitride film 32 and the first silicon oxide film 31. Then, the resist pattern is removed by ashing and the silicon substrate 30 is cleaned.

Figure 6B:
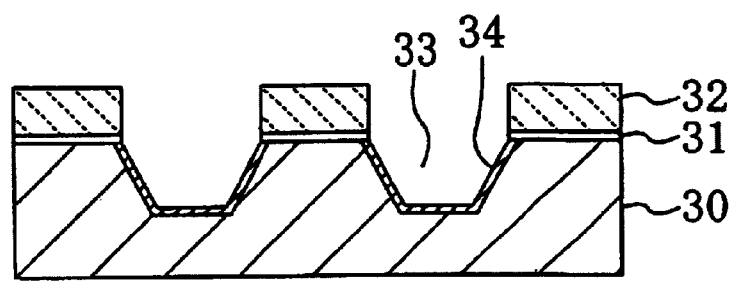

Next, as shown in FIG. 6B, dry etching is performed with respect to the silicon substrate 30 by using the patterned silicon nitride film 32 as a mask, thereby forming trenches 33 for isolation in the silicon substrate 30. During dry etching, a silicon layer having inferior crystalline properties or having an impurity mixed therein, i.e., a damaged layer 34 is formed in the portions of the silicon substrate 30 located adjacent the wall and bottom surfaces of the trenches 33. A detailed description will be given to the dry etching step shown in FIG. 6B. First, the silicon substrate 30 as an object to be etched is placed in the chamber (not shown) of a dry etching apparatus. Then, the chamber is evacuated till a specified degree of vacuum is reached and a first process gas required to etch the silicon substrate 30, e.g., a mixture of a halogen-containing gas such as $Cl_2$ or HBr gas and an oxygen gas is introduced into the chamber. Subsequently, a first plasma of the first process gas is generated with application of source power, while ions in the first plasma are drawn into the silicon substrate 30 with application of bias power. As a result, the ions in the first plasma and an exposed portion of the silicon substrate 30 react with each other to form a volatile reaction product. At this time, dry etching is performed with respect to the silicon substrate 30 by evacuating the chamber and thereby exhausting the volatile reaction product therefrom.

Since the dry etching step shown in FIG. 6B requires processing accuracy as high as required by the processing of a gate electrode due to a reduced size of the isolation, a dry etching apparatus having a dual power source, e.g., an inductively coupled plasma etching apparatus or the like is used in the dry etching step.

Next, after the completion of the dry etching step shown in FIG. 6B, the first process gas is exhausted from the chamber and then a second process gas containing at least oxygen is introduced into the chamber, while leaving the silicon substrate 30 in the chamber. Then, a second plasma of the second process gas is generated by applying the source gas without applying the bias power so that oxygen radicals in the second plasma and the damaged layer 34 react with each other, whereby an oxidized damaged layer 34A (specifically a silicon oxide film) is formed, as shown in FIG. 6C.

Figure 6C:
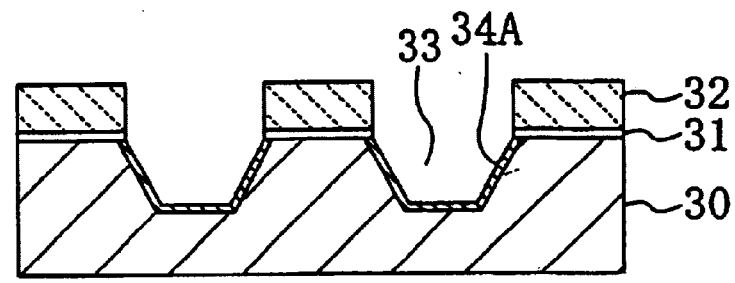

In the damaged layer oxidizing step shown in FIG. 6C, the effective value of the source power is set to, e.g., 600 W (while the effective value of the bias power is 0 W) and, e.g., $O_2$ gas (Pressure: 7 Pa, Gas Flow Rate: 50 ml/min) is used as a second process gas.

Figure 6D:
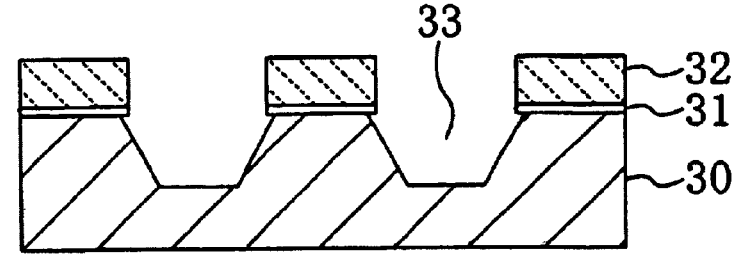

Next, the silicon substrate 30 is retrieved from the chamber. Then, as shown in FIG. 6D, the silicon substrate 30 is cleaned by using a chemical containing, e.g., HF or the like such that the oxidized damaged layer 34A and a deposit formed during dry etching performed with respect to the silicon substrate 30 are removed. This allows the formation of the trenches 33 in the silicon substrate 30 from which the damaged layer 34 has been removed.

Figure 6E:
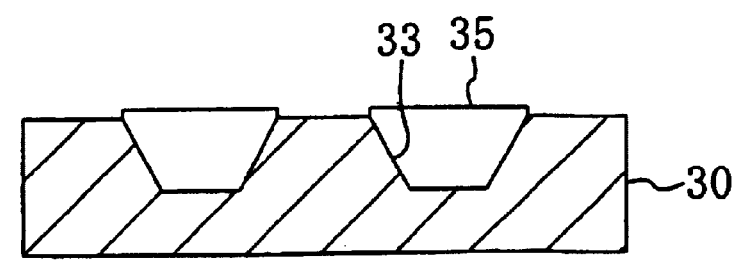

Next, the portions of the silicon substrate 30 located adjacent the wall and bottom surfaces of the trenches 33 are oxidized such that a surface state in the portions of the silicon substrate 30 is lowered. Then, a second oxide film 35 is deposited on the silicon nitride film 32 by, e.g., CVD to completely fill the trenches 33. Subsequently, a surface of the silicon nitride film 32 including a surface of the second oxide film 35 is planarized by CMP so that the portions of the silicon oxide film 35 located externally of the trenches 33 are removed. Then, as shown in FIG. 6E, the silicon nitride film 32 is removed by wet etching, while the first silicon oxide film 31 remaining on the surface of the silicon substrate 30 is removed by cleaning the silicon substrate 30, whereby isolations composed of the second silicon oxide film 35 filled in the trenches 33 are formed.

Thus, the third embodiment has formed the trenches 33 by performing etching with respect to the silicon substrate 30 by using the dry etching apparatus having the dual power source, oxidized the damaged layer 34 formed in the portions of the silicon substrate 30 located adjacent the wall and bottom surfaces of the trenches 33 during dry etching by applying the source power without applying the bias power by using the same dry etching apparatus having the dual power source, and then removed the oxidized damaged layer 34A by cleaning the substrate. This prevents the degradation of the electric characteristics of a semiconductor device induced by the damaged layer 34. Since the damaged layer 34 can be oxidized by using the dry etching apparatus having the dual power source used for dry etching in place of an oxidation furnace, the fabrication cost for the semiconductor device can be reduced significantly.

Although the third embodiment has used the inductively coupled plasma etching apparatus as the dry etching apparatus having the dual power source, it is also possible to use another dry etching apparatus having a dual power source such as an electron cyclotron resonance etcher, a dual-frequency capacitively coupled plasma etcher, or a surface wave plasma etcher.

Although the third embodiment has used the $O_2$ gas as a second process gas, it is also possible to use a mixture of the $O_2$ gas and an inert gas instead.

Although the third embodiment has used the same dry etching apparatus having the dual power source in each of the dry etching step shown in FIG. 6B and the damaged layer oxidizing step shown in FIG. 6C, different dry etching apparatus each having a dual power source may be used in the respective steps. Alternatively, a dry etching apparatus other than the one having a dual power source may also be used in the dry etching step shown in FIG. 6B. In the case of using a dry etching apparatus having a dual power source in the dry etching step shown in FIG. 6B, the application of the bias power is preferably initiated before oxidization proceeds at an exposed portion of the silicon substrate 30. Specifically, the application of the bias power is preferably initiated before the application of the source power is initiated or the source power and the bias power are preferably applied such that the effective value of the source power reaches a second predetermined value after the effective value of the bias power reaches a first predetermined value.

Although the third embodiment has described the case where dry etching is performed with respect to the silicon substrate to form the trenches for isolation, it is not limited thereto. Even in the case where dry etching is performed with respect to a silicon-containing material for another purpose, the effect of preventing the degradation of the electric characteristics of a semiconductor device induced by the damaged layer formed in the silicon-containing material during dry etching is achievable.

Embodiment 4

A method for fabricating a semiconductor device according to a fourth embodiment of the present invention will be described with reference to the drawings.

FIGS. 7A to 7D are cross-sectional views illustrating the individual process steps of the method for fabricating a semiconductor device according to the fourth embodiment.

Figure 7A:
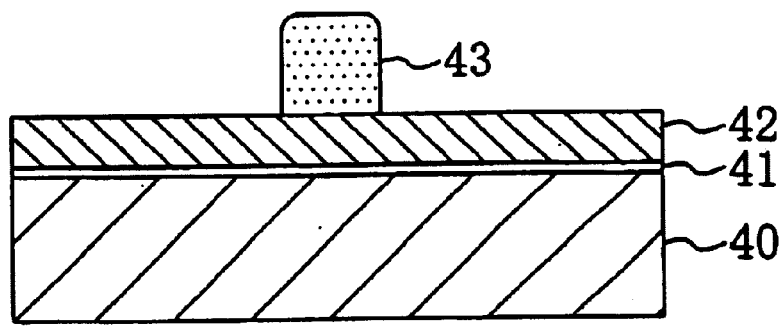
FIGS. 7A to 7D are cross-sectional views illustrating the individual process steps of a method for fabricating a semiconductor device according to a fourth embodiment of the present invention.

First, as shown in FIG. 7A, a gate insulating film 41 composed of a silicon oxide film is formed on the silicon substrate 40 by thermal oxidation, followed by a polysilicon film 42 formed on the gate insulating film 41 by using a film forming method such as CVD. Then, a resist pattern 43 covering a region to be formed with a gate electrode is formed on the polysilicon film 42 by photolithography.

Figure 7B:
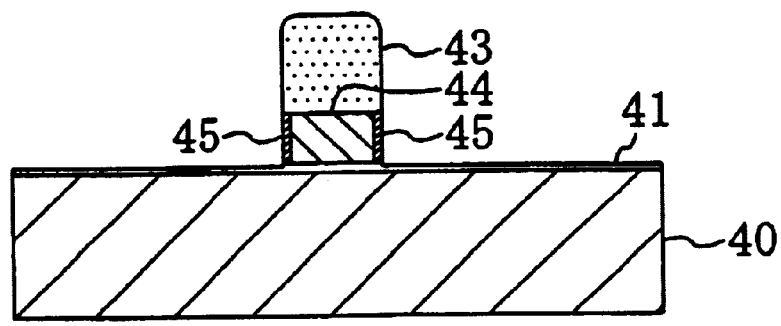

Next, as shown in FIG. 7B, dry etching is performed with respect to the polysilicon film 42 by using the resist pattern 43 as a mask, thereby forming a gate electrode 44 composed of the polysilicon film 42 on the silicon substrate 40 with a gate insulating film 41 interposed therebetween. During dry etching, a damaged layer 45 is formed in the side surface of the gate electrode 44. A detailed description will be given to the dry etching step shown in FIG. 7B. First, the silicon substrate 40 formed with the polysilicon film 42 as an object to be etched is placed in the chamber (not shown) of a dry etching apparatus. Then, the chamber is evacuated till a specified degree of vacuum is reached. Subsequently, a first process gas required to etch the polysilicon film 42, e.g., a mixture of a halogen-containing gas such as $Cl_2$ or HBr gas and an oxygen gas is introduced into the chamber. Thereafter, a first plasma of the first process gas is generated with application of source power, while ions in the first plasma are drawn into the polysilicon film 42 with application of bias power. As a result, the ions in the first plasma and an exposed portion of the polysilicon film 42 react with each other to form a volatile reaction product. At this time, dry etching is performed with respect to the polysilicon film 42 by evacuating the chamber and thereby exhausting the volatile reaction product therefrom, so that the gate electrode 44 composed of the polysilicon film 42 is formed.

Since the dry etching step shown in FIG. 7B requires high processing accuracy due to a reduced size of the gate, a dry etching apparatus having a dual power source such as an inductively coupled plasma etching apparatus is used therein.

Next, after the completion of the dry etching step shown in FIG. 7B, the first process gas is exhausted from the chamber and then a second process gas containing at least oxygen is introduced into the chamber, while leaving the silicon substrate 40 in the chamber. Then, a second plasma of the second process gas is generated by applying the source gas without applying the bias power so that oxygen radicals in the second plasma and the damaged layer 45 react with each other, whereby an oxidized damaged layer 45A (specifically a silicon oxide film) is formed, as shown in FIG. 7C.

Figure 7C:
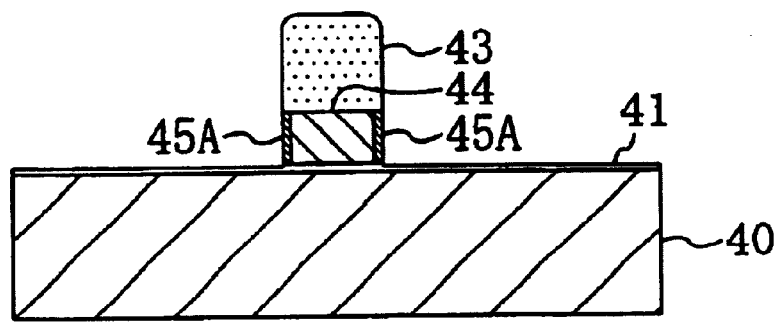

In the damaged layer oxidizing step shown in FIG. 7C, the effective value of the source power is set to, e.g., 600 W (while the effective value of the bias power is 0 W) and, e.g., $O_2$ gas (Pressure: 7 Pa, Gas Flow Rate: 40 ml/min) is used as a second process gas.

Figure 7D:
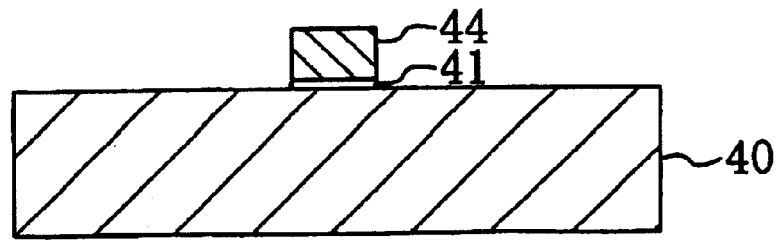

Next, the silicon substrate 40 is retrieved from the chamber and the resist pattern 43 is removed by ashing, as shown in FIG. 7D. Then, the silicon substrate 40 is cleaned by using a chemical containing, e.g., HF, whereby the oxidized damaged layer 45A, a deposit formed during dry etching performed with respect to the polysilicon film 42, and the portion of the gate insulating film 41 located externally of the gate electrode 44 are removed. This allows the formation of the gate electrode 44, from which the damaged layer 45 has been removed, on the silicon substrate 40 with the gate insulating film 41 interposed therebetween.

Thus, the fourth embodiment has formed the gate electrode 44 by performing etching with respect to the polysilicon film 42 by using the dry etching apparatus having the dual power source, oxidized the damaged layer 45 formed in the side surface of the gate electrode 44 during dry etching by applying the source power by using the same dry etching apparatus having the dual power source without applying the bias power, and then removed the oxidized damaged layer 45A by cleaning the substrate. This prevents the degradation of the electric characteristics of a semiconductor device induced by the damaged layer 45. Since the damaged layer 45 can be oxidized by using the dry etching apparatus having the dual power source used for dry etching in place of an oxidation furnace, the fabrication cost for the semiconductor device can be reduced significantly.

Although the fourth embodiment has used the inductively coupled plasma etching apparatus as the dry etching apparatus having the dual power source, it is also possible to use another dry etching apparatus having a dual power source such as an electron cyclotron resonance etcher, a dual-frequency capacitively coupled plasma etcher, or a surface wave plasma etcher.

Although the fourth embodiment has used the $O_2$ gas as a second process gas, it is also possible to use a mixture of the $O_2$ gas and an inert gas instead.

Although the fourth embodiment has used the same dry etching apparatus having the dual power source in each of the dry etching step shown in FIG. 7B and the damaged layer oxidizing step shown in FIG. 7C, different dry etching apparatus each having a dual power source may be used in the respective steps. Alternatively, a dry etching apparatus other than the one having a dual power source may also be used in the dry etching step shown in FIG. 7B. In the case of using a dry etching apparatus having a dual power source in the dry etching step shown in FIG. 7B, the application of the bias power is preferably initiated before oxidization proceeds at an exposed portion of the polysilicon film 42. Specifically, the application of the bias power is preferably initiated before the application of the source power is initiated or the source power and the bias power are preferably applied such that the effective value of the source power reaches a second predetermined value after the effective value of the bias power reaches a first predetermined value.

Although the fourth embodiment has used the polysilicon film as a conductive film composing the gate electrode, it is also possible to use another conductive film containing at least silicon, e.g., an amorphous silicon film or a silicide film such as a WSi film.

Although the fourth embodiment has described the case where dry etching is performed with respect to the polysilicon film to form the gate electrode, it is not limited thereto. Even if dry etching is performed with respect to a silicon-containing material for another purpose, the effect of preventing the degradation of the electric characteristics of a semiconductor device induced by the damaged layer formed in the silicon-containing material during dry etching is achievable.

Embodiment 5

A method for fabricating a semiconductor device according to a fifth embodiment of the present invention will be described with reference to the drawings.

FIGS. 8A to 8D are cross-sectional views illustrating the individual process steps of the method for fabricating a semiconductor device according to the fifth embodiment.

Figure 8A:
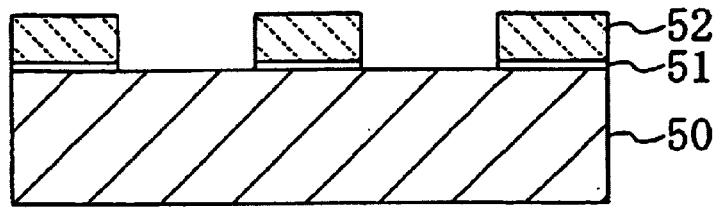
FIGS. 8A to 8D are cross-sectional views illustrating the individual process steps of a method for fabricating a semiconductor device according to a fifth embodiment of the present invention.

First, as shown in FIG. 8A, a first silicon oxide film 51 is formed on a silicon substrate 50 by, e.g., thermal oxidation, followed by a silicon nitride film 52 formed on the first silicon oxide film 51 by using a film forming method such as CVD. Then, a resist pattern (not shown) having openings each corresponding to a region to be formed with an isolation is formed on the silicon nitride film 52 by photolithography. Subsequently, dry etching is performed with respect to the silicon nitride film 52 and to the first silicon oxide film 51 by using the resist pattern as a mask, thereby patterning each of the silicon nitride film 52 and the first silicon oxide film 51. Thereafter, the resist pattern is removed by ashing and the silicon substrate 50 is cleaned.

Figure 8B:
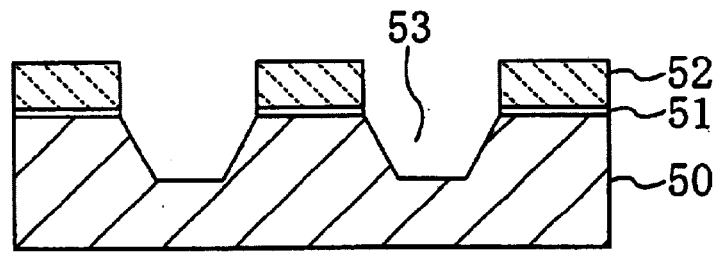

Next, as shown in FIG. 8B, dry etching is performed with respect to the silicon substrate 50 by using the patterned silicon nitride film 52 as a mask. Then, the silicon substrate 50 is cleaned such that a deposit formed during dry etching performed with respect to the silicon substrate 50 is removed, whereby trenches 53 for isolation are formed in the silicon substrate 50.

Figure 8C:
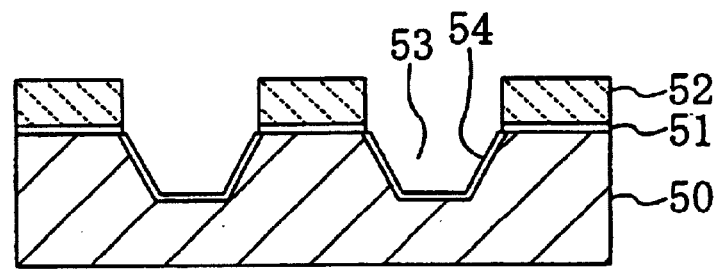

Next, as shown in FIG. 8C, a second silicon oxide film 54 is formed by oxidizing the portions of the silicon substrate 50 located adjacent the wall and bottom surfaces of the trenches 53. This lowers a surface state in the portions of the silicon substrate 50 and increases the breakdown voltage of the isolation by rounding up the corner portions of the trenches 53. In the fifth embodiment, the oxidizing step shown in FIG. 8C is performed by using a dry etching apparatus having a dual power source. A detailed description will be given to the oxidizing step shown in FIG. 8C. First, the silicon substrate 50 formed with the trenches 53 is placed in the chamber (not shown) of the dry etching apparatus having the dual power source. Then, the chamber is evacuated till a specified degree of vacuum is reached and a process gas required to oxidize the silicon substrate 50, i.e., a process gas containing at least oxygen is introduced into the chamber. Subsequently, a plasma of the process gas is generated by applying source gas without applying bias power so that oxygen radicals in the plasma and the portions of the silicon substrate 50 located adjacent the wall and bottom surfaces of the trenches 53 react with each other, whereby the second silicon oxide film 54 is formed.

In the damaged layer oxidizing step shown in FIG. 8C, an inductively coupled plasma etching apparatus, e.g., is used as a dry etching apparatus having a dual power source and the effective value of the source power is set to, e.g., 600 W (while the effective value of the bias power is 0 W). As a process gas, e.g., $O_2$ gas (Pressure: 7 Pa, Gas Flow Rate: 60 ml/min) is used.

Figure 8D:
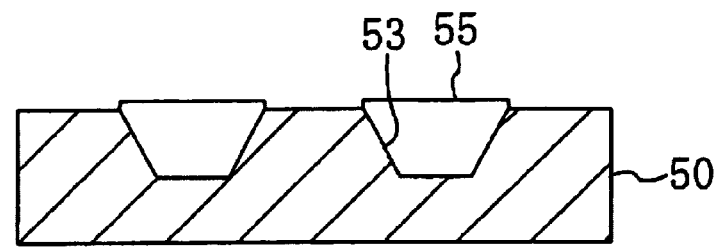

Next, the silicon substrate 50 is retrieved from the chamber and a third silicon oxide film 55 is deposited on the silicon nitride film 52 by, e.g., CVD to completely fill the trenches 53. Thereafter, a surface of the silicon nitride film 52 including a surface of the third silicon oxide film 55 is planarized by CMP to remove the portions of the third silicon oxide film 55 located externally of the trenches 53. It is to be noted that the second silicon oxide film 54 is integrated with the third silicon oxide film 55 during the deposition of the third silicon oxide film 55. Then, as shown in FIG. 8D, the silicon nitride film 52 is removed by wet etching and the silicon substrate 50 is cleaned such that the first silicon oxide film 51 remaining on the surface of the silicon substrate 50 is removed, whereby isolations composed of the third silicon oxide film 55 filled in the trenches 53 are formed.

Thus, the fifth embodiment has oxidized the portions of the silicon substrate 50 located adjacent the wall and bottom surfaces of the trenches 53 by applying the source power without applying the bias power by using the dry etching apparatus having the dual power source and thereby formed the silicon oxide film (the second silicon oxide film 54). This lowers a surface state in the portions of the silicon substrate 50 located adjacent the wall and bottom surfaces of the trenches 53 without using an oxidation furnace. In addition, the breakdown voltage of the isolation can be increased by rounding up the corner portions of the trenches 53 without using an oxidation furnace. This greatly reduces the fabrication cost for a semiconductor device.

Although the fifth embodiment has used the inductively coupled plasma etching apparatus as the dry etching apparatus having the dual power source, it is also possible to use another dry etching apparatus having a dual power source such as an electron cyclotron resonance etcher, a dual-frequency capacitively coupled plasma etcher, or a surface wave plasma etcher.

Although the fifth embodiment has used the $O_2$ gas as a process gas, it is also possible to use a mixture of the $O_2$ gas and an inert gas instead.

In the fifth embodiment, the step of forming a trench for isolation shown in FIG. 8B may also be performed by using the dry etching apparatus having the dual power source. During the step, the application of the bias power is preferably initiated before oxidization proceeds at an exposed portion of the silicon substrate 50. Specifically, it is preferable to initiate the application of the bias power before initiating the application of the source power or to perform the application of the source power and the bias power such that the effective value of the source power reaches a second predetermined value after the effective value of the bias power reaches a first predetermined value.

In the step of forming a trench for isolation of the fifth embodiment shown in FIG. 8B, it is preferable to perform dry etching with respect to the silicon substrate 50, oxidize the damaged layer formed during dry etching in the portions of the silicon substrate 50 located adjacent the wall and bottom surfaces of the trenches 53 by applying the source power without applying the bias power by using the dry etching apparatus having the dual power source, and then remove the oxidized damaged layer by cleaning the substrate. If dry etching is performed with respect to the silicon substrate 50 by using a dry etching apparatus having a dual power source, it is possible to continuously use the same dry etching apparatus to oxidize the damaged layer. It is also possible to concurrently perform the oxidization of the damaged layer in the oxidizing step shown in FIG. 8C by more deeply oxidizing the portions of the silicon substrate 50 located adjacent the wall and bottom surfaces of the trenches 53 than the damaged layer in the oxidizing step shown in FIG. 8C. In this case, the cleaning step for removing the oxidized damaged layer may be omitted.

Embodiment 6

A dry etching apparatus according to a sixth embodiment of the present invention, specifically a dry etching apparatus having a dual power source will be described with reference to the drawings.

Figure 9:
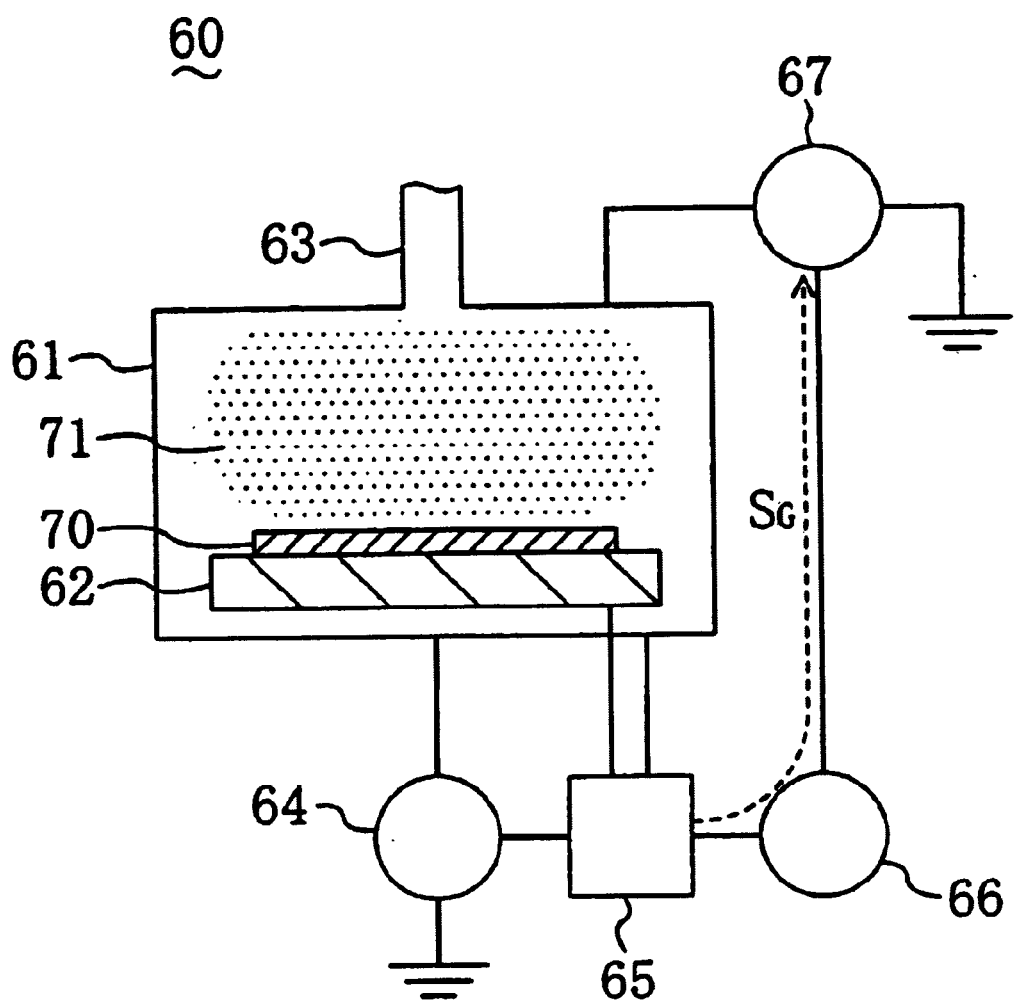
FIG. 9 shows a schematic structure of a dry etching apparatus according to a sixth embodiment of the present invention.

FIG. 9 shows a schematic structure of the dry etching apparatus according to the sixth embodiment(hereinafter referred to as the dry etching apparatus of the present invention).

As shown in FIG. 9, the dry etching apparatus 60 of the present invention comprises: a chamber 61 in which a plasma is generated; a sample stage 62 disposed on the bottom portion of the chamber 61; a gas supply inlet 63 through which a process gas is introduced into the chamber 61; a bias power supply 64 connected to the sample stage 62 to apply bias power thereto; a bias power monitor 65 connected to the bias power supply 64 to measure the effective value of the bias power applied to the sample stage 62; a timer 66 connected to the bias power monitor 65 to measure a time elapsed from the initiation of the application of the bias power; and a source power supply 67 connected to the timer 66 to apply source power to a coil (not shown) provided on an outer wall surface of the chamber 61.

Figure 10:
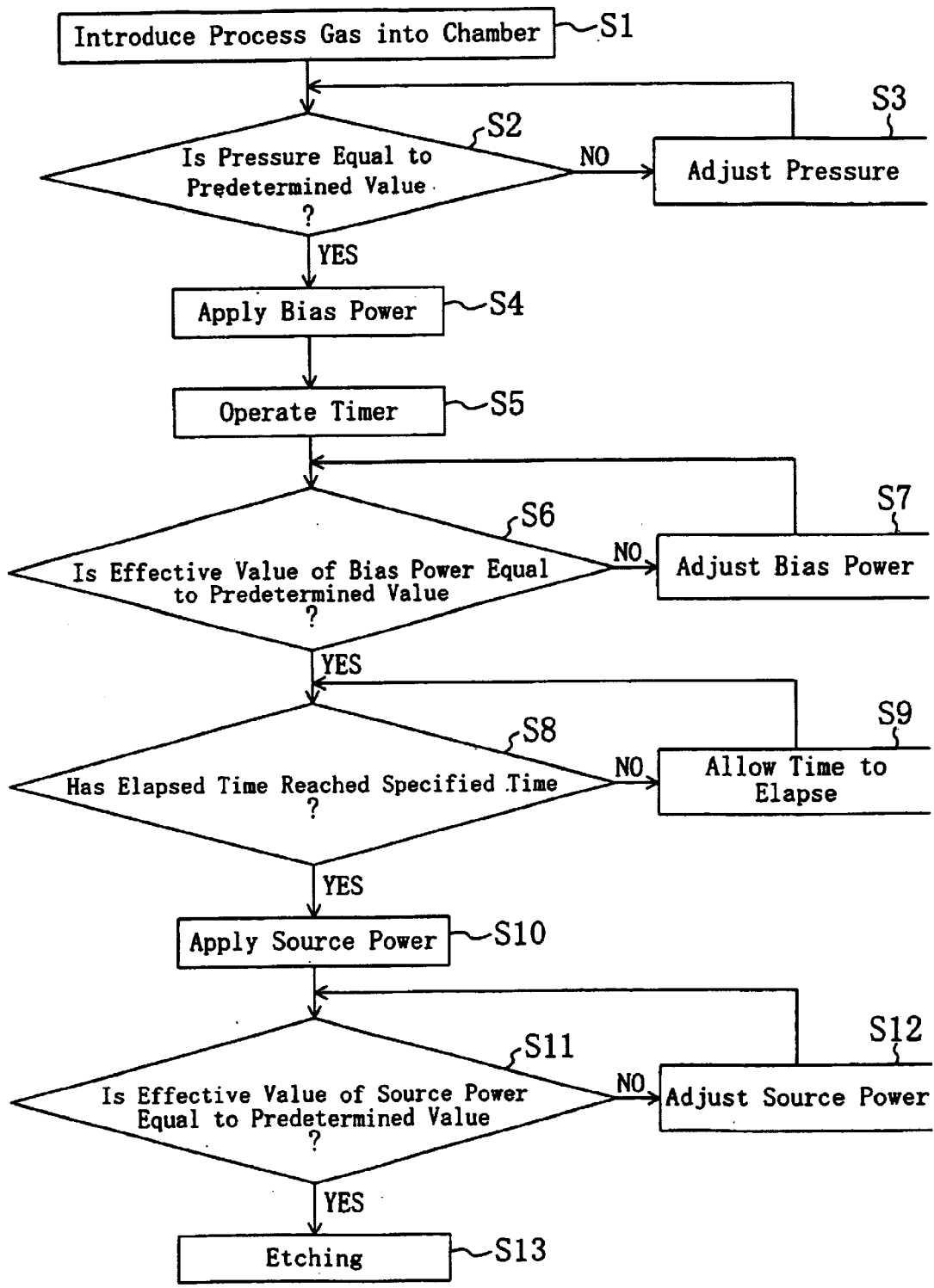
FIG. 10 is a flow chart illustrating a dry etching method using the dry etching apparatus according to the sixth embodiment.
Figure 11A:
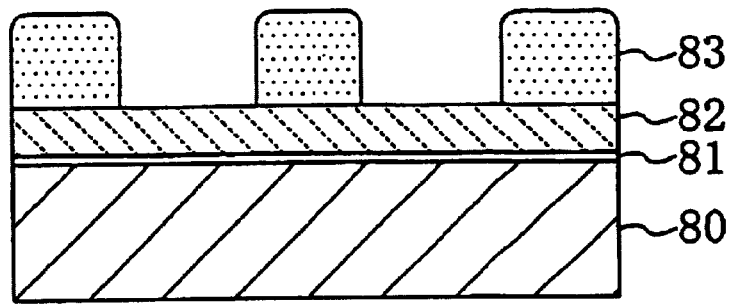
FIGS. 11A to 11D are cross-sectional views illustrating the individual process steps of the conventional method for fabricating a semiconductor device.
Figure 11B:
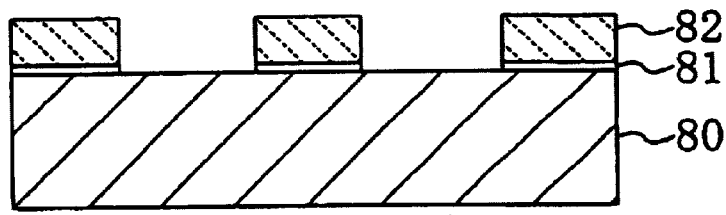
Figure 11C:
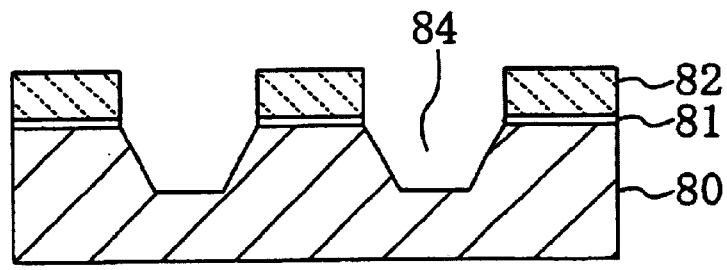
Figure 11D:
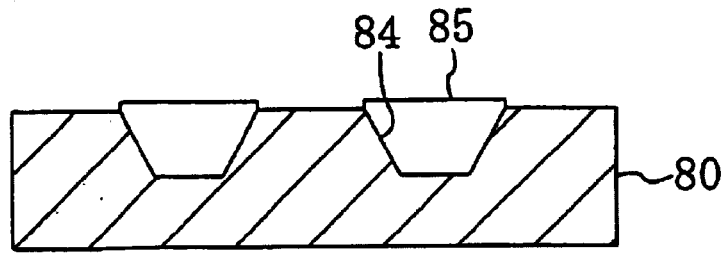
Figure 12:
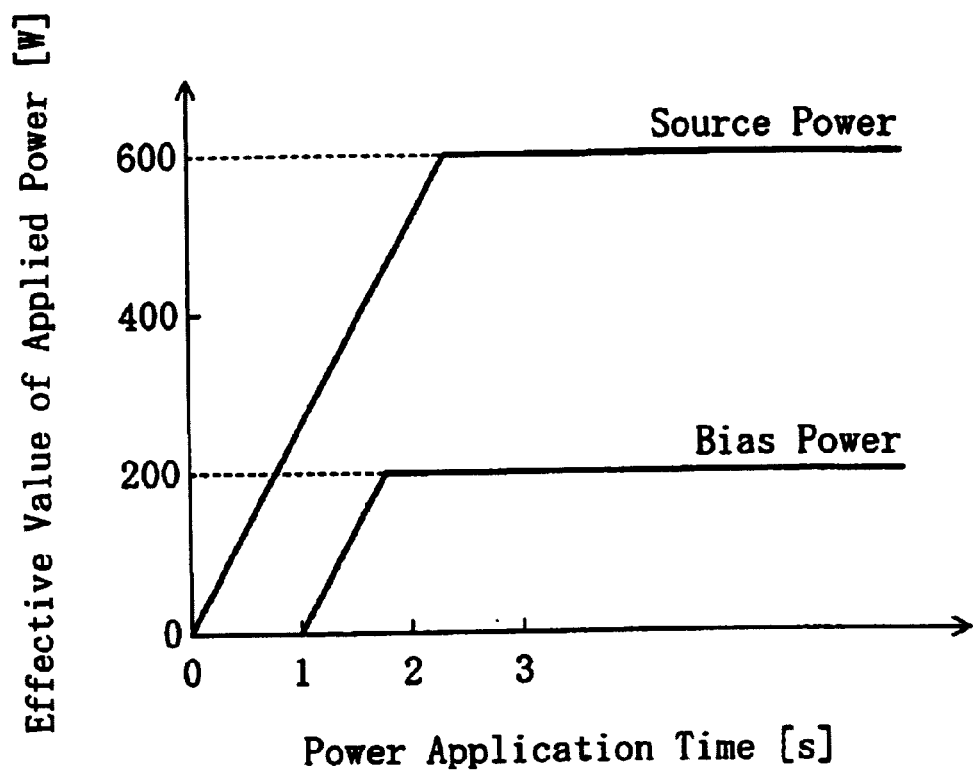
FIG. 12 shows an example of the respective time-varying effective values of the source power and the bias power in the dry etching step of the conventional method for fabricating a semiconductor device.
Figure 13A:
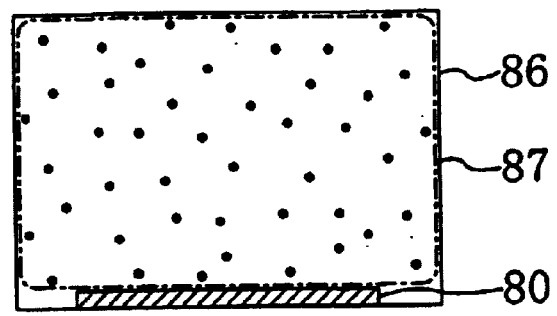
FIGS. 13A to 13C show changes in the internal state of the chamber of the dry etching apparatus in the dry etching step of the conventional method for fabricating a semiconductor device.
Figure 13B:
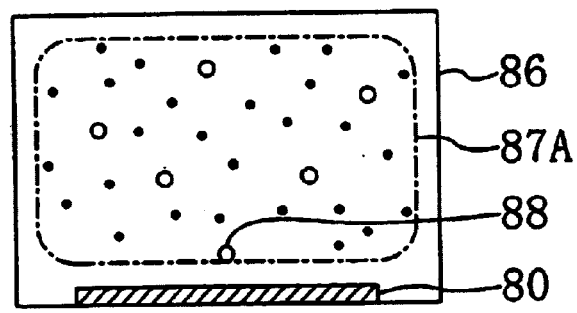
Figure 13C:
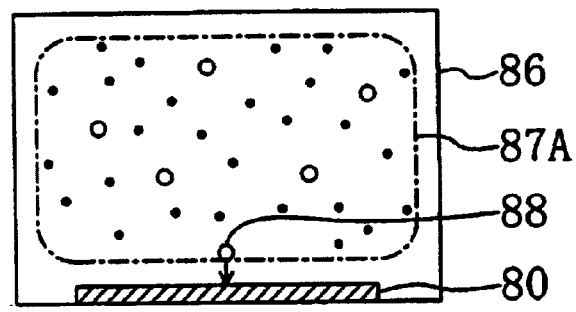
Figure 14:
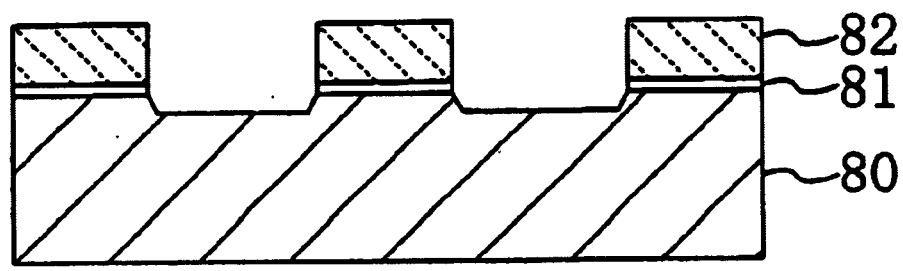
FIG. 14 is a view for illustrating a problem associated with the conventional method for fabricating a semiconductor device.

Herein below, a dry etching method using the dry etching apparatus of the present invention will be described with reference to the flow chart shown in FIG. 10.

First, in Step S1, an object 70 to be etched such as a silicon substrate is placed on the sample stage 62 in the chamber 61 and then the chamber 61 is evacuated till a specified degree of vacuum is reached. Subsequently, a process gas required to etch the object 70, e.g., a mixture of a halogen-containing gas and an oxygen gas is introduced through the gas supply inlet 63 into the chamber 61.

Next, in Step S2, it is checked whether or not the pressure of the process gas introduced into the chamber 61 is equal to a predetermined value. If the pressure of the process gas is not equal to the predetermined value, the pressure of the process gas is adjusted in Step S3 by, e.g., opening or closing an exhaust valve (not shown) till the pressure of the process gas becomes equal to the predetermined value.

When the pressure of the process gas becomes equal to the predetermined value, the bias power supply 64 then initiates the application of the bias power in Step S4. At this time, the bias power supply 64 simultaneously initializes the timer 65 and initiates the operation thereof in Step S5.

Next, in Step S6, it is checked whether or not the effective value of the bias power measured by the bias power monitor 65 is equal to a predetermined value. If the effective value of the bias power is not equal to the predetermined value, the effective value of the bias power is adjusted in Step S7 by using a matching circuit for applying bias power (not shown) or the like till the effective value of the bias power becomes equal to the predetermined value.

When the effective value of the bias power becomes equal to the predetermined value, it is then checked in Step S8 whether or not the time elapsed from the initiation of the application of the bias power that has been measured by the timer 66 has reached a specified time. If the elapsed time has not reached the specified time, the application of only the bias power is continued in Step S9 till the elapsed time reaches the specified time.

When the elapsed time reaches the specified time, the bias power monitor 65 emits a source-power-application indicating signal $S_G$ to the source power supply 67 in Step S10. Upon receipt of the source-power-application indicating signal $S_G$, the source power supply 67 initiates the application of the source power. Thus, the sixth embodiment initiates the application of the source power when the effective value of the bias power becomes equal to the predetermined value and the time elapsed from the initiation of the application of the bias power reaches the specified time.

Next, it is checked in Step S11 whether or not the effective value of the source power is equal to the predetermined value. If the effective value of the source power is not equal to the predetermined value, the effective value of the source power is adjusted in Step S12 by using a matching circuit for applying source power (not shown) or the like till the effective value of the source power becomes equal to the predetermined value. In the sixth embodiment, it is also possible to, e.g., connect the bias power monitor 65 to the coil to which the source power is applied and thereby measure the effective value of the source power by using the bias power monitor 65.

When the effective value of the bias power becomes equal to the predetermined value, etching is then performed with respect to the object to be etched 70 in Step S13. Specifically, in Step S13, a plasma 71 of the process gas is generated with application of the source power and ions in the plasma 71 are drawn into the object 70 with application of the bias power. As a result, the ions in the plasma 71 and the object 70 react with each other to form a volatile reaction product. At this time, dry etching is performed with respect to the object 70 by evacuating the chamber 61 and thereby exhausting the volatile reaction product from the chamber 61.

Thus, the dry etching apparatus according to the sixth embodiment comprises the bias power supply 64 for initiating the application of the bias power and simultaneously initializing and operating the timer 66 and the source power supply 67 for initiating the application of the source power when the elapsed time measured by the timer 66 reaches a specified time. Since the source power supply 67 initiates the application of the source power when the time elapsed from the time at which the bias power supply 64 initiates the application of the bias power reaches the specified time, the application of the bias power is initiated inevitably before the application of the source power is initiated. Even if etching is performed with respect to a silicon-containing material which is the object 70 by using a process gas containing oxygen, therefore, the ions in the plasma 71 can surely be drawn into the object 70 by initiating the application of the bias power before the object 70 is oxidized by oxygen radicals generated in the plasma 71 with application of the source power. This prevents the situation in which the drawing of the ions from the plasma 71 into the object 70 is inhibited by an oxide film formed on a surface of the object to 70 be etched and surely prevents a halfway halt in dry etching performed with respect to the object 70.

Although the source power supply 67 has initiated the application of the source power when the effective value of the bias power becomes equal to the predetermined value and the time elapsed from the initiation of the application of the bias power reaches the specified time in the sixth embodiment, if the predetermined value for the effective value of the source power is higher than the predetermined value for the effective value of the bias power, it is possible for the source power supply 67 to initiate the application of the source power when the time elapsed from the initiation of the application of the bias power reaches the specified time without measuring the effective value of the bias power by means of the bias power monitor 65. In this case, it is also possible for the source power supply 67 to initiate the application of the source power at the same time as the bias power supply 64 initiates the application of the bias power by setting the specified time to zero.

Although the bias power supply 64 for applying the bias power, the bias power monitor 65 for measuring the effective value of the bias power, and the timer 66 for measuring the time elapsed from the initiation of the application of the bias power are provided separately in the sixth embodiment, it is also possible to provide bias power applying means having the function of the bias power supply 64 and the function of the bias power monitor 65 or the function of the timer 66.

What is claimed is:

1. A dry etching method using a dry etching apparatus having a dual power source capable of independently controlling source power for generating a plasma in a chamber and bias power for drawing ions from the plasma into an object to be etched in the chamber, the method comprising the steps of:

placing a substrate having a member containing at least silicon exposed thereat in the chamber;

introducing a process gas containing at least oxygen into the chamber in which the substrate has been placed; and performing etching with respect to the member by generating a plasma of the process gas with application of the source power and drawing ions from the plasma into the member with application of the bias power, the step of performing etching with respect to the member including the step of generating the plasma by initiating the application of the bias power before oxidization proceeds at a surface of the member.

2. The method of claim 1, wherein the step of performing etching with respect to the member includes the step of applying the source power and the bias power such that an effective value of the source power reaches a second predetermined value after an effective value of the bias power reaches a first predetermined value.

3. The method of claim 1, wherein the member is a silicon substrate, a polysilicon film, an amorphous silicon film, or a silicide film.

4. The method of claim 1, wherein in the step of performing etching with respect to the member, an etching speed of a silicon oxide film is one hundredth or less of an etching speed of silicon.

5. A dry etching method using a dry etching apparatus having a dual power source capable of independently controlling source power for generating a plasma in a chamber and bias power for drawing ions from the plasma into an object to be etched in the chamber, the method comprising the steps of:

placing a substrate having a member containing at least silicon exposed thereat in the chamber;

introducing a process gas containing at least oxygen into the chamber in which the substrate has been placed; and performing etching with respect to the member by generating a plasma of the process gas with application of the source power and drawing ions from the plasma into the member with application of the bias power, wherein the step of performing etching with respect to the member includes the step of initiating the application of the bias power before initiating the application of the source power.

6. The method of claim 5, wherein the member is a silicon substrate, a polysilicon film, an amorphous silicon film, or a silicide film.

* * * * *